United States Patent
Cheng et al.

(10) Patent No.: US 8,062,767 B2
(45) Date of Patent: Nov. 22, 2011

(54) ORGANIC LIGHT EMITTING DIODE CONTAINING A IR COMPLEX HAVING A NOVEL LIGAND AS A PHOSPHORESCENT EMITTER

(75) Inventors: Chien-Hong Cheng, Hsinchu (TW); Wei-Hsien Liao, Hsinchu (TW); Hung-Hsin Shih, Hsinchu (TW); Min-Jie Huang, Hsinchu (TW); Ting-Wei Tang, Hsinchu (TW)

(73) Assignee: Chien-Hong Cheng, Hsinchu (TW)

( * ) Notice: Subject to any disclaimer, the term of this patent is extended or adjusted under 35 U.S.C. 154(b) by 1101 days.

(21) Appl. No.: 11/682,864

(22) Filed: Mar. 6, 2007

(65) Prior Publication Data
US 2008/0217606 A1 Sep. 11, 2008

(51) Int. Cl.
*H05B 33/14* (2006.01)
*C09K 11/06* (2006.01)

(52) U.S. Cl. ........ 428/690; 428/917; 313/504; 313/506; 257/40; 257/79; 257/102; 257/E51.044; 548/101; 548/255; 548/262.2; 548/300.1; 548/356.1

(58) Field of Classification Search ........... 257/E51.044, 257/79, 102; 313/504, 506; 428/690, 917; 548/101, 262.2, 300.1, 356.1, 255
See application file for complete search history.

(56) References Cited

U.S. PATENT DOCUMENTS

| | | | |
|---|---|---|---|
| 2004/0091738 A1* | 5/2004 | Psai et al. | 428/690 |
| 2005/0116626 A1* | 6/2005 | Cheng et al. | 313/504 |
| 2005/0227109 A1* | 10/2005 | Cheng et al. | 428/690 |
| 2006/0286404 A1* | 12/2006 | Wu | 428/690 |
| 2007/0048546 A1* | 3/2007 | Ren | 428/690 |
| 2007/0087221 A1* | 4/2007 | Wu et al. | 428/690 |
| 2007/0141394 A1* | 6/2007 | Cheng et al. | 428/690 |

FOREIGN PATENT DOCUMENTS

TW 231157 * 4/2005

OTHER PUBLICATIONS

Yang et al. Inorg. Chem. 2005, 44, 7770-7780.*
Coppo et al. Chem. Commun. 2004, 1774-1775.*
Yeh et al. Adv. Mater. 2005, 17, 285-289.*
Liang et al. J. Mater. Chem. 2006, 16, 1281-1286.*

* cited by examiner

Primary Examiner — David W Wu
Assistant Examiner — Vu A Nguyen
(74) Attorney, Agent, or Firm — WPAT, PC; Justin King

(57) ABSTRACT

An organic light emitting diode with Ir complex is disclosed in this specification, wherein the Ir complex is used as the phosphorous emitter. The chemical containing pyridyl triazole or pyridyl imidazole functional group is used as the auxiliary monoanionic bidentate ligand in the mentioned Ir complex, so that the CIE coordinate of the mentioned Ir complex is adjustable and the light emitting performance of the Ir complex is improved.

25 Claims, 7 Drawing Sheets

ORGANIC LIGHT EMITTING DIODE CONTAINING A IR COMPLEX HAVING A NOVEL LIGAND AS A PHOSPHORESCENT EMITTER

BACKGROUND OF THE INVENTION

1. Field of the Invention

The present invention is generally related to an organic light-emitting diode (OLED), and more particularly to an OLED containing an Ir (iridium) complex as a phosphorescent emitter where pyridyl triazole or pyridyl imidazole is used as an auxiliary mono-anionic bichelate ligand for the Ir complex.

2. Description of the Prior Art

At present, phosphorescent metal complex has been utilized as a phosphorescent dopant for organic light-emitting diodes (OLEDs). Among these metal complexes used in the emitter of OLEDs, Ir complexes have been comprehensively studied because of its strong spin-orbital coupling property in the electron configuration. Since the spin-orbital coupling causes mixing between the singlet state and the triplet state, the lifetime of the triplet state is thus reduced to thereby increase phosphorescence efficiency. Generally, these Ir complexes have regular octahedron structures containing positive trivalent oxidation states. The light emitting mechanism comes from emission of the triplet metal-to-ligand charge-transfer transition state ($^3$MLCT state) or the ligand triplet state ($^3\pi$-$\pi$).

US published patent application no. US2002/0034656A1 discloses metal complexes as phosphorescent emitters, comprising octahedron complexes $L_2MX$ (M=Ir, Pt) using vinylpyridine (L) as ligands where the Ir complexes comprise of various N—C heterocyclic ligands and Ir.

On the other hand, the research reports published by the department of chemistry, National Tsing Hua University in various journals (referring to References 1-3) disclose some diazoheterocyclic compounds used as the third ligand for Ir complexes.

Taiwan patent application no. 93137789 applied by the assignee of the present invention discloses an Ir complex as phosphorescent emitters in OLEDs, using benzoimidazole as mono-anionic bichelate ligands.

REFERENCES

1. C. H. Yang, S. W. Li, Y. Chi, Y. M. Cheng, Y. S. Yeh, P. T. Chou, G. H. Lee, C. H. Wang, C. F. Shu, *Inorg. Chem.* 2005, 44, 7770-7780.
2. S. J. Yeh, M. F. Wu, C. T. Chen, Y. H. Song, Y. Chi, M. H. Ho, S. F. Hsu, C. H. Chen, *Adv. Mater.* 2005, 17, 3, 285-289.
3. Chris S. K. Mak, Anna Hayer, Sofia I. Pascu, Scott E. Watkinsc, Andrew B. Holmes, Anna Köhler, Richard H. Friend, *Chem. Commun.* 2005, 4708-4710.

SUMMARY OF THE INVENTION

One major object of the present invention is to provide an Ir (iridium) complex used as a phosphorescent emitter for OLEDs. The organic light emitting diodes prepared according to the invention has the characteristics of high brightness, high external quantum efficiency, high current efficiency, and excellent CIE coordinates.

Another object of the present invention is to provide an Ir complex used as a phosphorescent emitter for OLEDs emitting green to red lights.

The Ir complex according to the present invention comprises the following octahedron six-coordinated complexes I, II, III, IV, V, or VI having the structure shown in the following:

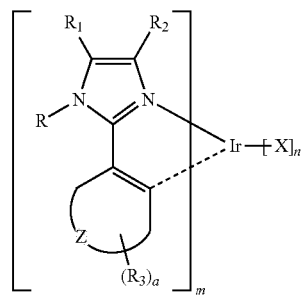

I

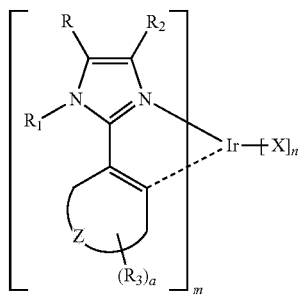

II

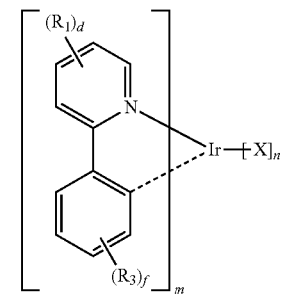

III

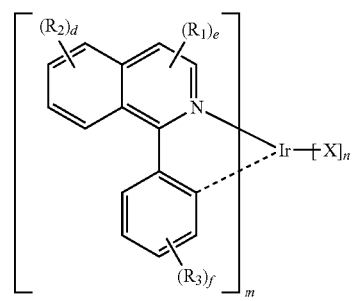

IV

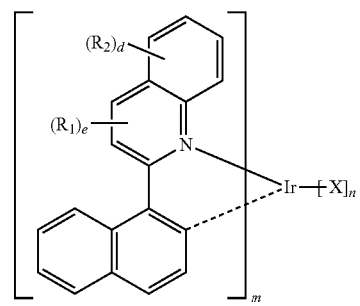

V

VI

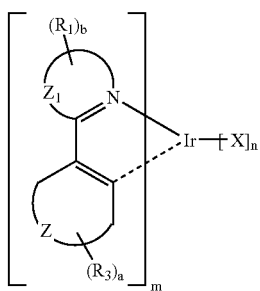

in which m is 0, 1, or 2, n is a positive integer, and m+n=3;

R, R₁, R₂, or R₃ independently represents a hydrogen atom, halogen atom (such as F, Cl, Br, or I), aryl, C1~C20 alkyl (such as methyl, ethyl, butyl, or cyclohexyl), aryl substituted C1~C20 alkyl (such as benzyl), C2~C20 alkenyl, C2-C20 alkynyl, halogen substituted C1~C20 alkyl (such as trifluoromethyl), C1~C20 alkoxyl, C1~C20 substituted amino, C1~C20 acyl, C1-C20 ester, C1~C20 amido, halogen substituted aryl, halogen substituted aralkyl, haloalkyl group substituted aryl, haloalkyl group substituted aralkyl, cyano, or nitro group;

Z is any atomic group that comprises aryl, cyclene or heterocyclic ring group;

Z₁ is any atomic group that comprises a nitrogen containing herterocyclic ring group; and a is 0 or any positive integer that depends on the Z containing aryl, cyclene or heterocyclic ring group;

b is 0 or any positive integer that depends on the N (nitrogen atom) and Z₁ containing herterocyclic ring;

d is a positive integer from 0 to 4;

e is a positive integer from 0 to 2;

f is a positive integer from 0 to 4;

X is L₁, L₂, L₃, or L₄ having the following structure:

L₁

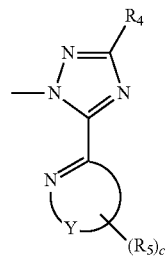

L₂

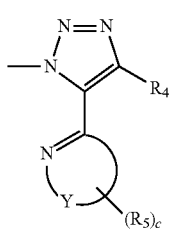

L₃

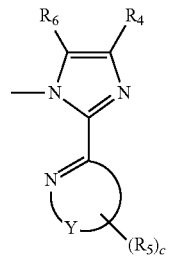

L₄

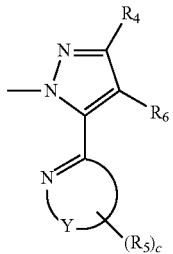

where R₄ and R₆ have the same definition as R₂, R₅ has the same definition as R₃, Y is any atomic group that comprises a nitrogen containing herterocyclic ring group (hereinafter referred to as N containing herterocyclic ring group) and c is 0 or any positive integer that depends on the N (nitrogen atom) and Y containing herterocyclic ring group;

the aryl group comprises phenyl, naphthyl, diphenyl, anthryl, pyrenyl, phenanthryl, fluorenyl, or other multiple phenyl substituted group;

the cyclene group comprises cyclohexene, cyclohexadiene, cyclopentene, cyclopentadiene, or other cyclene;

the herterocyclic ring group is pyrane, pyrroline, furan, benzofuran, thiophene, benzothiophene, pyridine, quinoline, isoquinoline, pyrazine, pyrimidine, pyrrole, pyrazole, imidazole, indole, thiazole, isothiazole, oxazole, isoxazole, benzothiazole, benzoxazole, phenanthroline or other herterocyclic ring; and the N containing herterocyclic ring group comprises pyridine, quinoline, isoquinoline, pyrazine, pyrimidine, pyrrole, pyrazole, imidazole, indole, thiazole, isothiazole, oxazole, isoxazole, benzothiazole, benzoxazole, or phenanthroline or other herterocyclic ring.

Preferably, the N (nitrogen atom) and Y containing herterocyclic ring group is pyridine. More preferably, c is zero.

Preferably, the complex comprises the structure having the L₁ ligand.

Preferably, the complex comprises the structure having the L₂ ligand.

Preferably, the complex comprises the structure having the L₃ ligand.

Preferably, m is 2 and n is 1.

DESCRIPTION OF THE PREFERRED EMBODIMENTS

Figure 1:
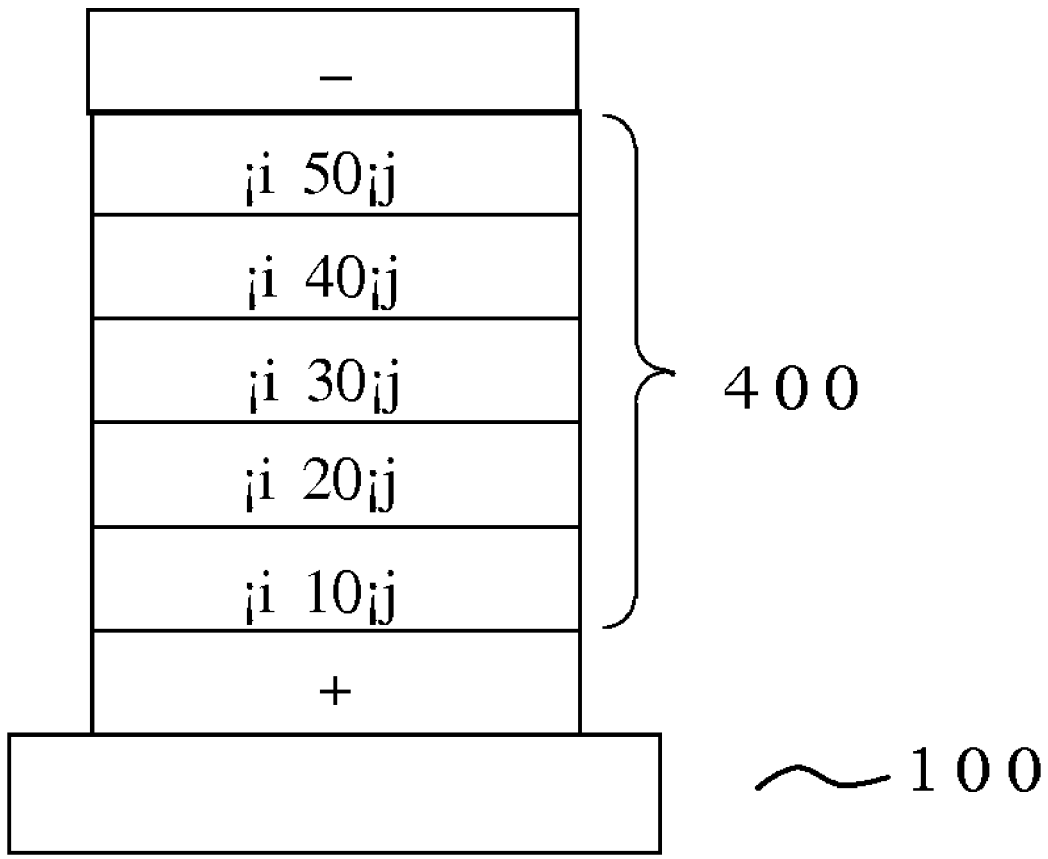
FIG. 1 shows a schematic diagram illustrating the structure of a multi-layered OLED device.

In addition to the synthesis and spectral properties of the phosphorescent Ir complex according to the present invention, the complex used as OLED phosphorescent materials will be described in the following. The structure of the OLED is bi-layered, tri-layered, or multiple layered. FIG. 1 shows a schematic diagram illustrating the structure of a multi-layered OLED device. The actual thickness of each layer is not related to the size shown in the figure. The device comprises a substrate 100, a positive electrode (+), a hole-injection layer 10, a hole-transporting layer 20, an electron-blocking layer (not shown in the figure), an emitter 30, a hole-blocking layer 40, an electron-transporting layer 50, and a negative electrode (−). The electron-blocking layer, hole-blocking layer 40 and hole-injection layer 10 can be included or excluded in the structure, depending on the devices. The elements between the positive and negative electrodes comprise the electroluminescent medium 400 of the device. The emitter is formed by doping the phosphorescent materials as a dopant into the host compound.

PREFERRED EMBODIMENTS

Example 1

1-methyl-4-phenyl-1H-imidazole (mpi)

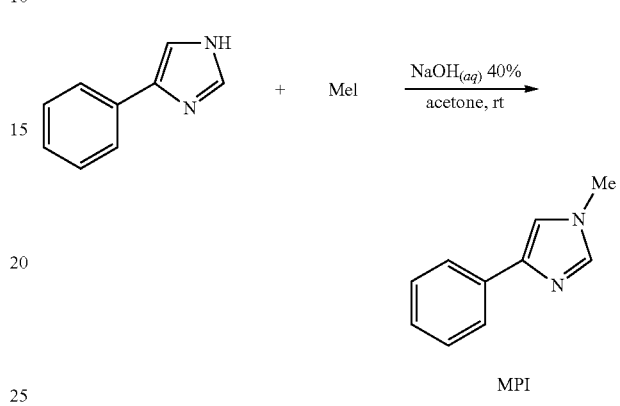

MPI

Synthesis is carried out according the above reaction formula.
$^1$H NMR (CDCl$_3$, δ): δ 7.75 (d, J=5.8 Hz, 2 H), 7.45 (s, 1 H), 7.35 (t, J=6.0 Hz, 2 H), 7.21 (t, J=5.8 Hz, 1 H), 7.15 (d, J=1.2 Hz, 1H), 3.70 (s, 3 H).

Example 2

1-benzyl-4-phenyl-1H-imidazole (bpi)

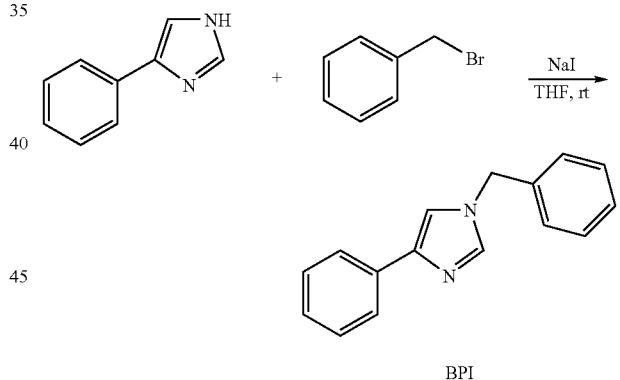

BPI

Synthesis is carried out according the above reaction formula.
$^1$H NMR (CDCl$_3$, δ): δ 7.74 (d, J=6.4 Hz, 2 H), 7.57 (s, 1 H), 7.35~7.32 (m, 5 H), 7.21~7.16 (m, 4 H), 5.12 (s, 2 H).

Example 3

1,2-diphenyl-1H-benzoimidazole (pbi)

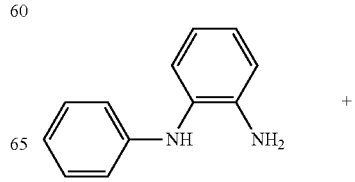

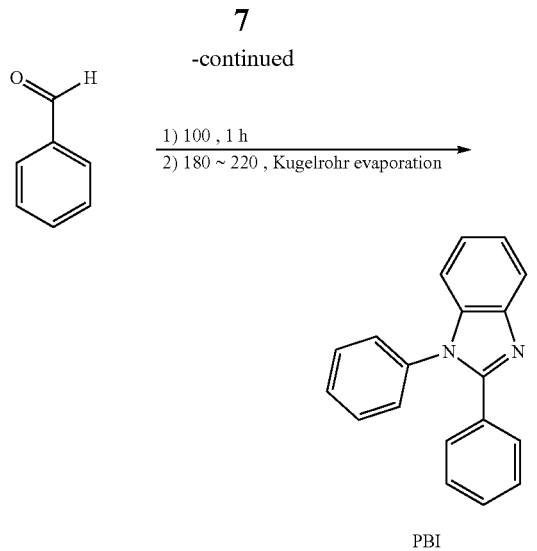

PBI

Synthesis is carried out according the above reaction formula. $^1$H NMR (400 MHz, CDCl$_3$): δ 7.90 (d, 1 H, J=8.0 Hz), 7.58 (d, 2 H, J=6.8 Hz), 7.52~7.46 (m, 3 H), 7.37~7.27 (m, 8 H).

Example 4

4-Methyl-2-naphthalen-1-yl-quinoline (mnq)

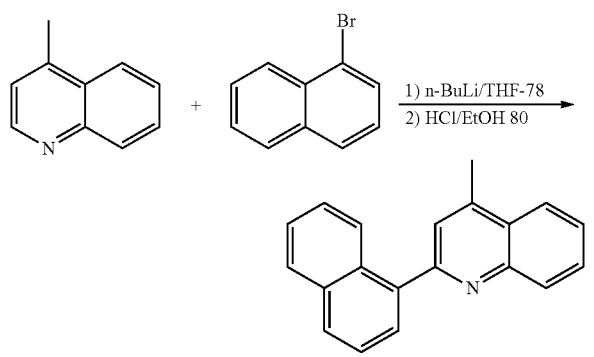

Synthesis is carried out according the above reaction formula. $^1$H NMR (400 MHz, CDCl$_3$): δ 7.90 (d, 1 H, J=8.0 Hz), 7.58 (d, 2 H, J=6.8 Hz), 7.52~7.46 (m, 3 H), 7.37~7.27 (m, 8 H).

Example 5

2-(5-(Trifluoromethyl)-4H-1,2,4-triazol-3-yl)pyridine (tfpytz)

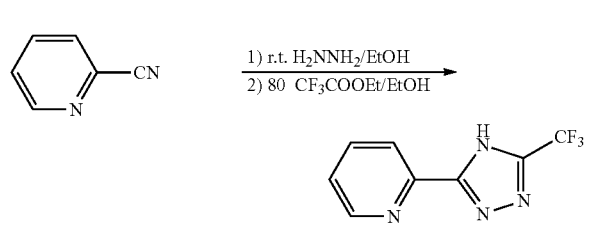

2-cyanopyridine (1.04 g, 10.0 mmol) is placed in a 25 ml round-bottomed flask and ethanol is added into 2-cyanopyridine. After completly dissolved, hydrazine (0.96 g, 30.0 mmol) is added. At the room temperature, the reaction is carried out for 12 hrs. White solids are obtained. Ether is used to rinse the solids in order to remove the unreacted hydrazine. The white solids are placed in a 25 ml round-bottomed flask and added with ethyl 2,2,2-trifluoroacetate (1.42 g, 10.0 mmol). 5.0 ml of ethanol is added and then hot reflux is performed for 12 hrs. After the reaction is finished, ether extraction is carried out and the organic layer is collected and then concentrated to obtain white solids. After purified by silicone chromatographic column, the product tfpytz is obtained. The yield is about 50%. $^1$H NMR (500 MHz, CDCl$_3$): δ 8.78 (m, 1 H), 8.31 (d, 1 H, J=8.0 Hz), 7.97~7.94 (m, 1 H), 7.53~7.50 (m, 1 H). HRMS (EI) m/z:calculated value C$_8$H$_5$F$_3$N$_4$ 214.0466; experimental value 214.0469.

Example 6

2-(3H-1,2,3-triazol-4-yl)pyridine (pytz)

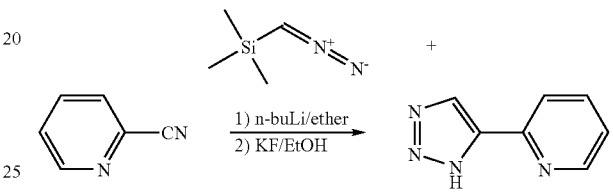

A 250 ml reaction flask is dried under vacuum and baked by fire and then cooled by nitrogen gas flow. 50 ml of anhydrous ether is added into the flask and (trimethylsilyl)diazomethane (6 ml, 12.0 mmol) is also added. At −78° C., n-butyl lithium agent (6 ml, 14.4 mmol) is added. After reacting for 0.5 hrs, 2-cyanopyridine (1.04 g, 10.0 mmol) is added. The reaction is then carried out for 12 hrs. After the reaction is finished, ether extraction is carried out and the organic layer is collected and then concentrated to obtained white solids. The white solids are placed in a 50 ml reaction flask, potassium fluoride (0.58 g, 10.0 mmol) is added, 10 ml of ethanol is added, and a few drops of hydrochloride are added. Hot reflux is carried out for 2 hrs. After the reaction is finished, the reaction solution is neutralized by saturated sodium bicarbonate solution. Ether extraction is carried out and the organic layer is collected and then concentrated to obtain white solids. After purified by silicone chromatographic column, the product pytz is obtained. The yield is about 60%. $^1$H NMR (500 MHz, CDCl$_3$): δ 8.70 (s, 1 H), 8.36 (s, 1 H), 7.99 (s, 1 H), 7.82 (t, 1 H, J=8.0 Hz), 7.32-7.29 (m, 1 H). HRMS (EI) m/z:calculated value C$_7$H$_6$N$_4$ 146.0592; experimental value 146.0593.

Example 7

(2-(4,5-Dimethyl-1H-imidazol-2-yl)pyridine (pydmi)

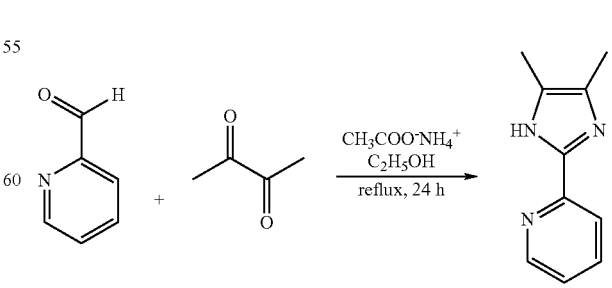

Ammonium acetate 12 g (excess amount) is added to a 250 ml two-necked flask. The flask is filled with nitrogen and the vacuumed for three times. Butanedione (2.12 ml, 20.0 mmol) and pyridinecarboxaldehyde (1.68 ml, 20.0 mmol) are added and then 40 ml of ethanol is added. After reacting for 12 hrs, extraction with a small amount of methylene chloride is carried out for three times. The water layer is collected, added with saturated sodium bicarbonate solution, and then stirred for 1 hr. White solids are precipitated and the precipitation is collected to be dried and weighted. The product is pydmi. The yield is about 50%. $^1$H NMR (400 MHz, CDCl$_3$): δ 10.37 (br, 1 H), 8.44-8.43 (m, 1 H), 8.07 (d, 1 H, J=7.2 Hz), 7.72-7.67 (m, 1 H), 7.16-7.13 (m, 1 H), 2.20 (s, 3 H), 2.19 (s, 3 H). $^{13}$C NMR (100 MHz, CDCl$_3$): δ 148.67, 148.38, 143.25, 137.08, 135.08, 123.45, 122.33, 119.45, 12.27, 9.42. HRMS (EI) m/z: calculated value C$_{10}$H$_{11}$N$_3$ 173.0953; experimental value 173.0956.

Example 8

2-(1H-imidazol-2-yl)pyridine)(pyi)

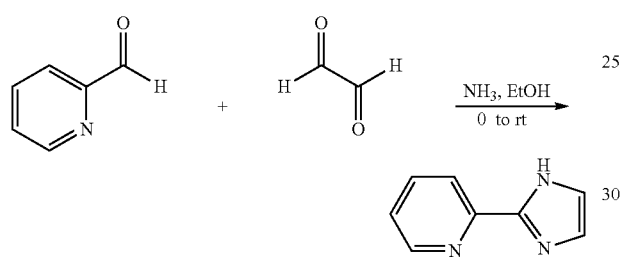

Pyridinecarboxaldehyde (1.07 g, 10 mmol) and 10 ml of glyoxal are separately added into a reaction flask containing 5 ml of ethanol. Under ice bath, the two solutions are then mixed together and added with 15 ml of ammonia water. At 0° C., the reaction is carried out for 30 minutes. Returned to the room temperature, the reaction is further carried out for 2 hrs. After the reaction is finished, extraction with methylene chloride is carried out and the organic layer is collected and concentrated to obtain yellow solids. After recrystallization by ethyl acetate, the product pyi is obtained. The yield is about 30%. $^1$H NMR (500 MHz, CDCl$_3$): δ 8.53-8.52 (m, 1 H), 8.35 (d, 1 H, J=7.5 Hz), 7.80 (q, 1 H, J=1.2 Hz), 7.30-7.28 (m, 1 H), 7.27 (s, 2 H).

Example 9

2-(4,5-dihydro-1H-imidazol-2-yl)pyridine (pyiI)

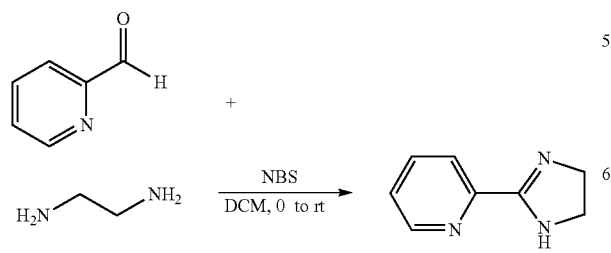

Pyridinecarboxaldehyde (0.95 ml, 10 mmol) is added into a reaction flask containing 20 ml of methylene chloride and ethylene diamine (0.78 ml, 10.5 mmol) is added. After the reaction is carried out at 0° C. for 20 minutes, N-bromosuccinimide (1.87 g, 10.5 mmol) is added. The reaction temperature is slowly raised from 0° C. to the room temperature and the reaction is further carried out for 24 hrs at the room temperature. 10% sodium hydroxide solution is added to have the solution become alkaline. After extraction with a small amount of methylene chloride is carried out for 2 times, the organic layer is collected and concentrated to obtain white solids. After purified by silicone chromatographic column, the product pyiI is obtained. The yield is about 90%. $^1$H NMR (400 MHz, CDCl$_3$): δ 8.55-8.54 (m, 1 H), 8.11 (d, 1 H, J=7.6 Hz), 7.76-7.71 (m, 1 H), 7.34-7.21 (m, 1 H), 3.82 (s, 4 H).

Example 10

1-methyl-2-(1H-5-pyrazolyl)-1H-imidazole (mip)

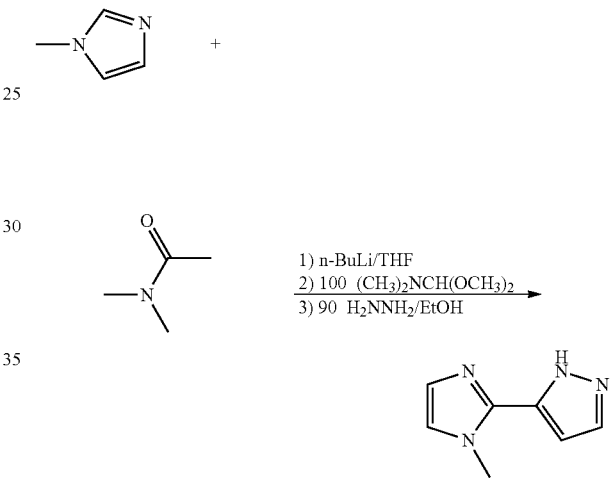

A 100 ml two-necked reaction flask is dried under vacuum and baked by fire and then cooled by nitrogen gas flow. 50 ml of anhydrous tetrahydrofuran and 1-Methylimidazole (10 mmol, 0.8 ml) are added. n-Butyl lithium agent (12 mmol, 4.8 ml) is slowly added at −78° C. After the reaction has been taken place for 15 minutes, N,N-Dimethylacetamide (12 mmole, 1.12 ml) is added into the flask to react at the room temperature. Extraction with ether and water is carried out and the organic layer is concentrated to obtain a liquid product. The yield is 83%. The obtained product is then reacted with N,N-Dimethylformamide dimethyl acetal (12.45 mmol, 1.65 ml) without any solvent at 100° C. for 10 hrs. Extraction with methylene chloride and water is carried out and the organic layer is concentrated to obtain solids. The yield is 93%. The obtained product is dissolved in ethanol and then added with hydrazine (28.95 mmol, 1.40 ml). The reaction is carried out for 3 hrs at 90° C. The reaction solution is concentrated and extracted by methylene chloride and water. The organic layer is concentrated and separated by n-hexane and ethyl acetate through chromatographic column. The product mip is thus obtained and the yield is 71%. $^1$H NMR (400

MHz, CD$_2$Cl$_2$): δ 7.63 (d, 1 H, J=2 Hz), 7.09 (br, 1 H), 6.98 (s, 1 H), 6.71 (br, 1 H), 3.928 (s, 3 H).

Example 11

1-benzyl-2-(1H-5-pyrazolyl)-1H-imidazole (bip)

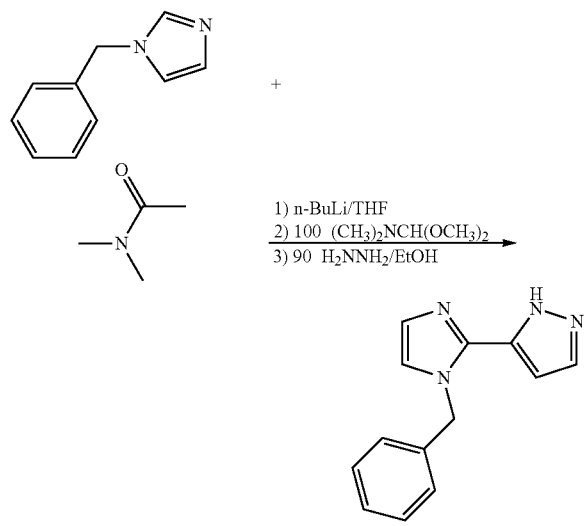

According to the steps in example 10 except that 1-benzylimidazole is used as the starting material, the product bip is obtained and the yield is 70-80%, under the same reaction conditions. $^1$H NMR (400 MHz, CD$_2$Cl$_2$): δ 7.57 (d, 1H, J=2.4 Hz), 7.34-7.25 (m, 3 H), 7.17-7.13 (m, 3 H), 6.98 (s, 1 H), 6.71 (br, 1 H), 5.62 (br, 2 H).

Example 12

1-phenyl-2-(1H-5-pyrazolyl)-1H-imidazole (pip)

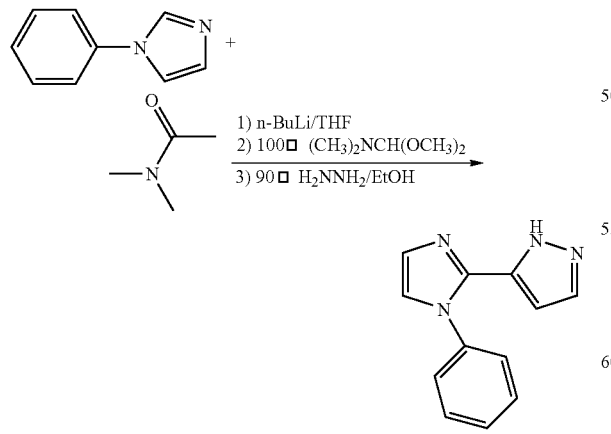

According to the steps in example 10 except that 1-phenylimidazole is used as the starting material, the product pip is obtained and the yield is 70-80%, under the same reaction conditions. $^1$H NMR (400 MHz, CD$_2$Cl$_2$): δ 7.53-7.52 (m, 4 H), 7.40-7.37 (m, 3 H), 7.31 (br, 1 H), 7.17 (s, 1 H).

Example 13

1-methyl-2-(3-methyl-1H-5-pyrazolyl)-1H-imidazole (mimp)

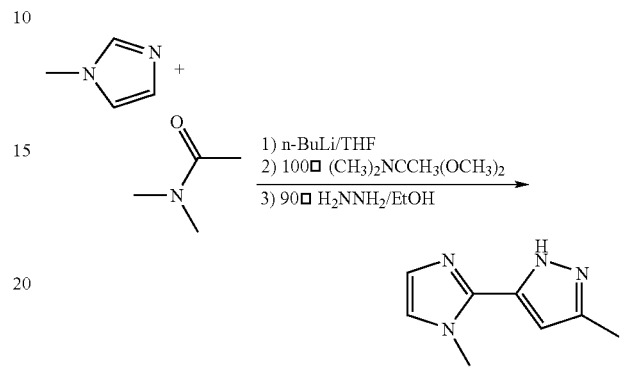

A 100 ml two-necked reaction flask is dried under vacuum and baked by fire and then cooled by nitrogen gas flow. 50 ml of anhydrous tetrahydrofuran and 1-Methylimidazole (10 mmol, 0.8 ml) are added. n-Butyl lithium agent (12 mmol, 4.8 ml) is slowly added at −78° C. After the reaction has been taken place for 15 minutes, N,N-Dimethylacetamide (12 mmole, 1.12 ml) is added into the flask to react at the room temperature. Extraction with ether and water is carried out and the organic layer is concentrated to obtain a liquid product. The yield is 83%. The obtained product is then reacted with N,N-Dimethylacetamide dimethyl acetal (12.45 mmol, 1.82 ml) without any solvent at 100° C. for 10 hrs. Extraction with methylene chloride and water is carried out and the organic layer is concentrated to obtain solids. The yield is 90%. The obtained product is dissolved in ethanol and then added with hydrazine (28.01 mmol, 1.36 ml). The reaction is carried out for 3 hrs at 90° C. The reaction solution is concentrated and extracted by methylene chloride and water. The organic layer is concentrated and separated by n-hexane and ethyl acetate through chromatographic column. The product mimp is thus obtained and the yield is 75%. $^1$H NMR (400 MHz, CD$_2$Cl$_2$): δ 7.04 (s, 1 H), 6.94 (s, 1 H), 6.74 (s, 1 H), 3.91 (s, 3 H), 2.34 (s, 3 H).

Example 14

1-benzyl-2-(3-methyl-1H-5-pyrazolyl)-1H-imidazole (bimp)

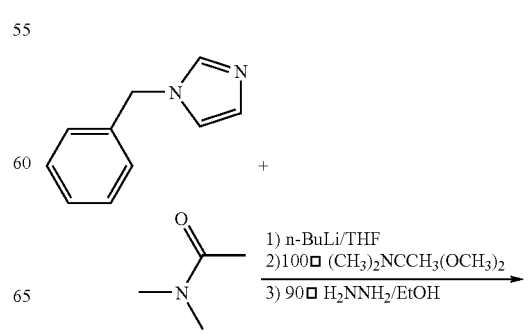

-continued

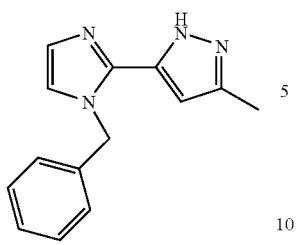

According to the steps in example 13 except that 1-benzylimidazole is used as the starting material, the product bimp is obtained and the yield is 70~80%, under the same reaction conditions. $^1$H NMR (400 MHz, CD$_2$Cl$_2$): δ 7.33-7.25 (m, 3 H), 7.16-7.08 (m, 2 H), 6.94 (s, 1 H), 6.48 (d, 1 H, J=10.2 Hz), 6.47 (br, 1 H), 5.63 (br, 2 H), 2.30 (s, 3 H).

Example 15

2-(3-methyl-1H-5-pyrazolyl)-1-phenyl-1H-imidazole (pimp)

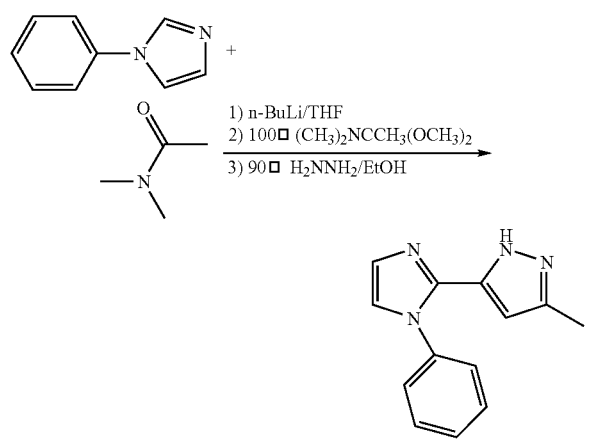

According to the steps in example 13 except that 1-phenylimidazole is used as the starting material, the product pimp is obtained and the yield is 70~80%, under the same reaction conditions. $^1$H NMR (400 MHz, CD$_2$Cl$_2$): δ 7.52-7.51 (m, 3 H), 7.42 (s, 1 H), 7.38-7.36 (m, 2 H), 7.24 (s, 1 H), 7.13 (d, 1 H, J=1.2 Hz), 2.15 (s, 3 H).

Example 16

1-methyl-2-(3-trifluoromethyl-1H-5-pyrazolyl)-1H-imidazole (micfp)

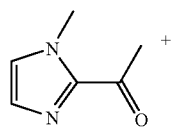

-continued

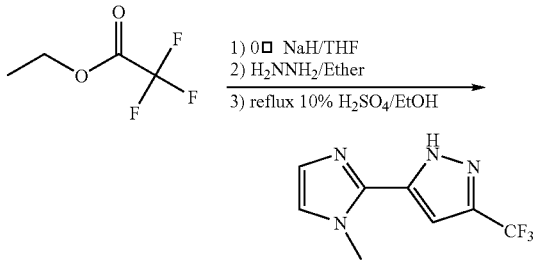

Sodium hydride (23 mmol, 0.552 g) from a glove box is placed in a 150 ml two-necked reaction flask and added with anhydrous tetrahydrofuran and ethyl trifluoroacetate (12 mmol, 2.04 ml). The reaction is taken placed for 15 minutes under ice bath. 1-(1-methyl-1H-2-imidazolyl)-1-ethanone (10 mmol, 1.32 g) is then slowly added. After the reaction is carried out for 3 hrs, water is added to terminate the reaction and acid is added to have the solution become acidic. After concentrated, the reaction solution is extracted by methylene chloride and water. The organic layer is concentrated to obtain brown viscous solids. The obtained solids are dissolved in ethanol and added with 10% sulfuric acid to carry out refluxing for 8 hrs. After concentrated, the product micfp is rinsed by n-hexane and the yield is 74%. $^1$H NMR (400 MHz, CD$_2$Cl$_2$): δ 7.30 (d, 1 H, J=1.2 Hz), 7.10 (d, 1 H, J=1.2 Hz), 6.83 (s, 1 H), 3.89 (s, 3 H).

Example 17

1-benzyl-2-(3-trifluoromethyl-1H-5-pyrazolyl)-1H-imidazole (bicfp)

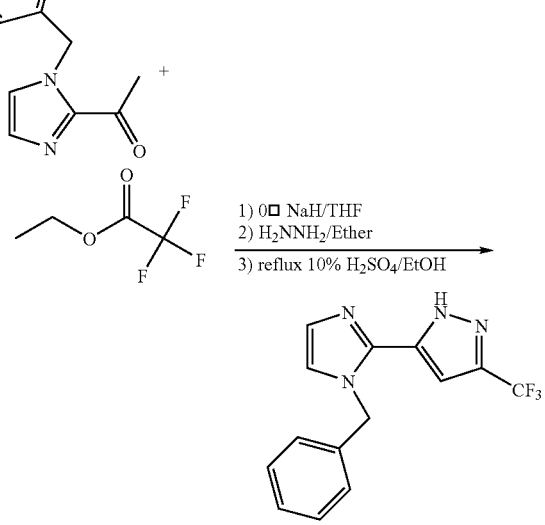

According to the steps in example 16 except that 1-(1-benzyl-1H-2-imidazolyl)-1-ethanone is used as the starting material, the product bicfp is obtained and the yield is 65~70%, under the same reaction conditions. $^1$H NMR (400 MHz, CD$_2$Cl$_2$):

δ 7.43-7.35 (m, 4 H), 7.15 (d, 2 H, J=6.8 Hz), 7.11 (d, 1 H, J=1.2 Hz), 6.58 (s, 1 H), 5.41 (s, 2 H).

Example 18

1-phenyl-2-(3-trifluoromethyl-1H-5-pyrazolyl)-1H-imidazole (picfp)

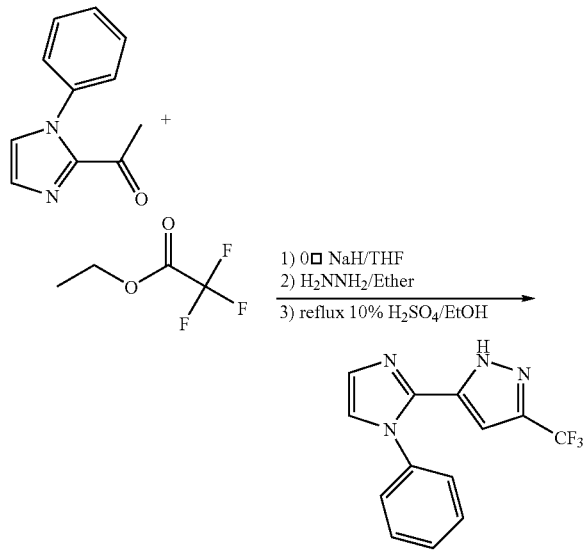

According to the steps in example 16 except that 1-(1-phenyl-1H-2-imidazolyl)-1-ethanone is used as the starting material, the product picfp is obtained and the yield is 65~70%, under the same reaction conditions. $^1$H NMR (400 MHz, CD$_2$Cl$_2$): δ 7.63-7.57 (m, 3 H), 7.47 (d, 1 H, J=1.2 Hz), 7.47-7.41 (m, 2 H), 7.26 (d, 1 H, J=1.2 Hz), 5.70 (s, 1 H).

Example 19

1-methyl-2-(4-methyl-1H-5-pyrazolyl)-1H-imidazole (4mimp)

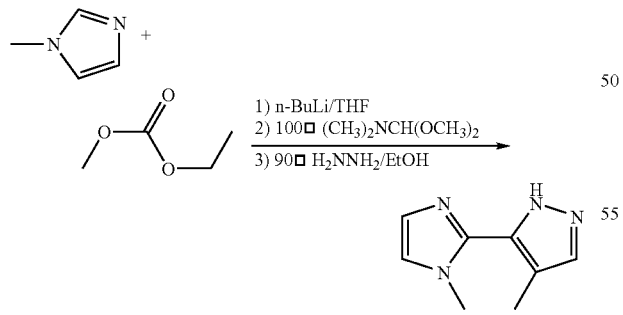

A 100 ml two-necked reaction flask is dried under vacuum and baked by fire and then cooled by nitrogen gas flow. 50 ml of anhydrous tetrahydrofuran and 1-Methylimidazole (10 mmol, 0.8 ml) are added. n-Butyl lithium agent (12 mmol, 4.8 ml) is slowly added at −78° C. After the reaction has been taken place for 15 minutes, ethyl methyl carbonate (12 mmol, 1.25 g) is added into the flask to react at the room temperature. Extraction with ether and water is carried out and the organic layer is concentrated to obtain a liquid product. The yield is 95%. The obtained product is then reacted with N,N-Dimethylformamide dimethyl acetal (14.25 mmol, 1.89 ml) without any solvent at 100° C. for 10 hrs. Extraction with methylene chloride and water is carried out and the organic layer is concentrated to obtain solids. The yield is 93%. The obtained product is dissolved in ethanol and then added with hydrazine (33.13 mmol, 1.61 ml). The reaction is carried out for 3 hrs at 90° C. The reaction solution is concentrated and extracted by methylene chloride and water. The organic layer is concentrated and separated by n-hexane and ethyl acetate through chromatographic column. The product 4mimp is thus obtained and the yield is 68%. $^1$H NMR (400 MHz, CD$_2$Cl$_2$): δ 7.44 (d, 1 H, J=0.8 Hz), 7.05 (d, 1 H, J=1.2 Hz), 6.95 (d, 1 H, J=1.2 Hz), 3.87 (s, 3 H), 2.29 (d, J=0.8 z, 3H).

Example 20

1-benzyl-2-(4-methyl-1H-5-pyrazolyl)-1H-imidazole (4bimp)

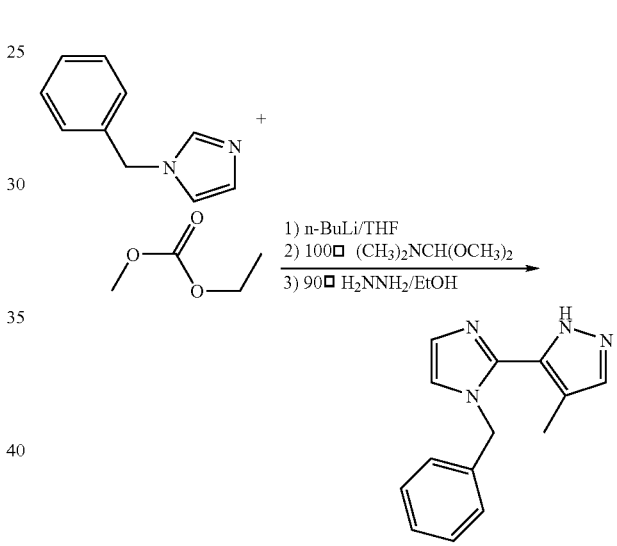

According to the steps in example 19 except that 1-benzylimidazole is used as the starting material, the product 4bimp is obtained and the yield is 53%, under the same reaction conditions. $^1$H NMR (400 MHz, CD$_2$Cl$_2$): δ 7.42(d, 1 H, J=0.8 Hz), 7.31-7.24 (m, 3 H), 7.13 (s, 1 H), 7.12-7.10 (m, 2 H), 6.96 (d, 1 H, J=1.2 Hz), 5.57 (s, 2 H), 2.39 (s, 3 H).

Example 21

2-(1H-5-pyrazolyl)pyrazine (pzp)

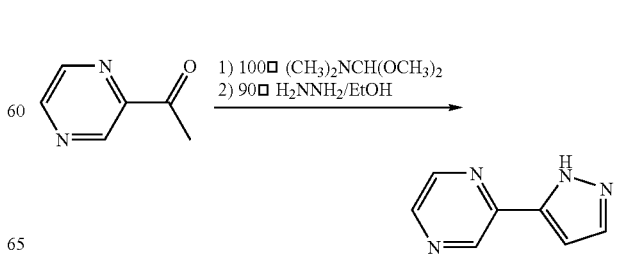

2-Acetylpyrazine (10 mmol, 1.22 g) is reacted with N,N-Dimethylformamide dimethyl acetal (15 mmol, 1.99 ml) without any solvent at 100° C. for 10 hrs. Extraction with methylene chloride and water is carried out and the organic layer is concentrated to obtain solids. The yield is 94%. The obtained product is dissolved in ethanol and then added with hydrazine (23.5 mmol, 1.14 ml). The reaction is carried out for 3 hrs at 90° C. The reaction solution is concentrated and extracted by methylene chloride and water. The product is rinsed by n-hexane and some ethanol. The product pzp is thus obtained and the yield is 83%. $^1$H NMR (400 MHz, CDCl$_3$): δ 9.11 (s, 1 H), 8.55 (s, 1 H), 8.50 (d, 1 H, J=2.8 Hz), 7.69 (d, 1 H, J=1.6 Hz), 6.93 (d, 1 H, J=2.0 Hz).

Example 22

2-(3-methyl-1H-5-pyrazolyl)pyrazine (pzmp)

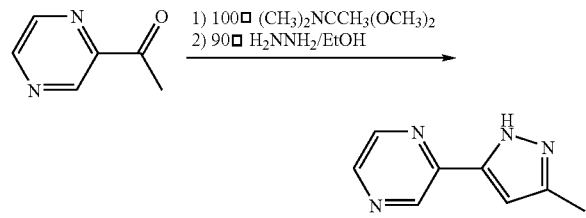

According to the steps in example 21 except that N,N-Dimethylacetamide dimethyl acetal (1.5 eq) is used as the starting material, the product pzmp is obtained and the yield is 76%, under the same reaction conditions. $^1$H NMR (400 MHz, CDCl$_3$): δ 9.07 (d, 1 H, J=1.2 Hz), 8.53 (t, 1 H, J=1.2 Hz), 8.46 (d, 1 H, J=2.8 Hz), 6.66 (s, 1 H), 2.38 (s, 3 H).

Example 23

Synthesis of Ir Complex (L)$_2$Ir(tfpytz)

2.2 mmol of the compound selected from examples 1~7 is dissolved in 10 ml of 2-ethoxyethanol and then 1 mmol of iridium trichloride hydrate and 3 ml of water are added. The mixture is stirred at 120° C. under nitrogen environment for 12 hrs and then cooled to the room temperature. The precipitation is collected. After washed by ethanol and acetone and dried under vacuum, the cyclometalated Ir(III)-μ-chloro-bridged dimer is obtained. 1 mmol of the dimer, 5 mmol of tfpytz, and 10 mmol of sodium carbonate are dissolved in 15 ml of 2-ethoxyethanol. The mixture is refluxed under nitrogen environment at 120° C. for 12 hrs. After cooled to the room temperature, 2-ethoxyethanol is removed by distillation and the remained substance is dissolved in methylene chloride. Sodium carbonate is then removed by filtration. The solution is then concentrated under vacuum and then the remained substance is purified by silicone chromatographic column using methylene chloride and n-hexane as the eluent. The Ir complex is further purified by sublimation at 200~220° C. with a pressure of 4×10$^{-3}$ Pa before used in the device fabrication.

Example 24

Ir Complex II-1: (mpi)$_2$Ir(tfpytz)

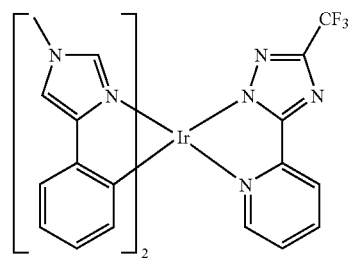

Figure 2:
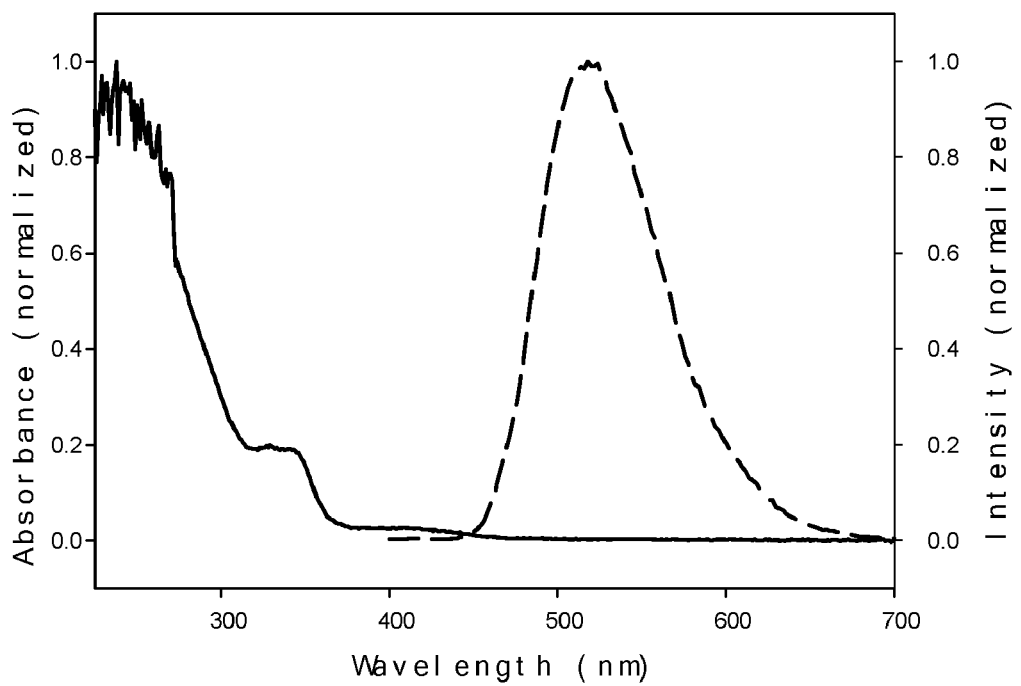
FIG. 2 shows the ultraviolet absorption spectrum and emission spectrum of the synthesized Ir complex dissolved in methylene chloride according to the example 24 of the present invention.

MPI in example 1 is used as the ligand (L). The complex II-1 is prepared according to the steps in example 23. The yield is 61%. FIG. 2 shows the ultraviolet absorption spectrum and emission spectrum of the II-1 dissolved in methylene chloride. The emitting light is green and its wavelength is 518 nm. $^1$H NMR (400 MHz, CDCl$_3$): δ 8.22 (d, 1 H, J=7.6 Hz), 7.97 (d, 1 H, J=6.0 Hz), 7.76 (t, 1 H, J=7.8 Hz), 7.24-7.22 (m, 1 H), 7.08 (t, 1 H, J=7.6 Hz), 6.92-6.91 (m, 3 H), 6.85-6.66 (m, 5 H), 6.59 (s, 1 H), 6.39 (d, 1 H, J=7.6 Hz), 6.33 (d, 1 H, J=7.6 Hz), 3.60 (s, 3 H), 3.58 (s, 3 H). HRMS (FAB) m/z: calculated value C$_{28}$H$_{22}$F$_3$IrN$_8$ 720.1549; experimental value 720.1550.

Example 25

Ir Complex II-2: (bpi)$_2$Ir(tfpytz)

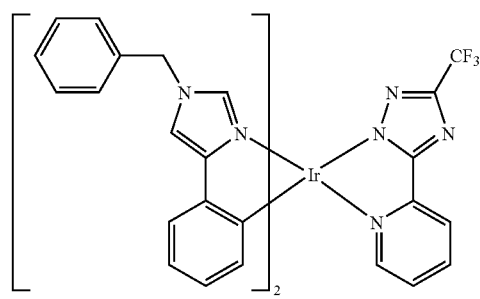

Figure 3:
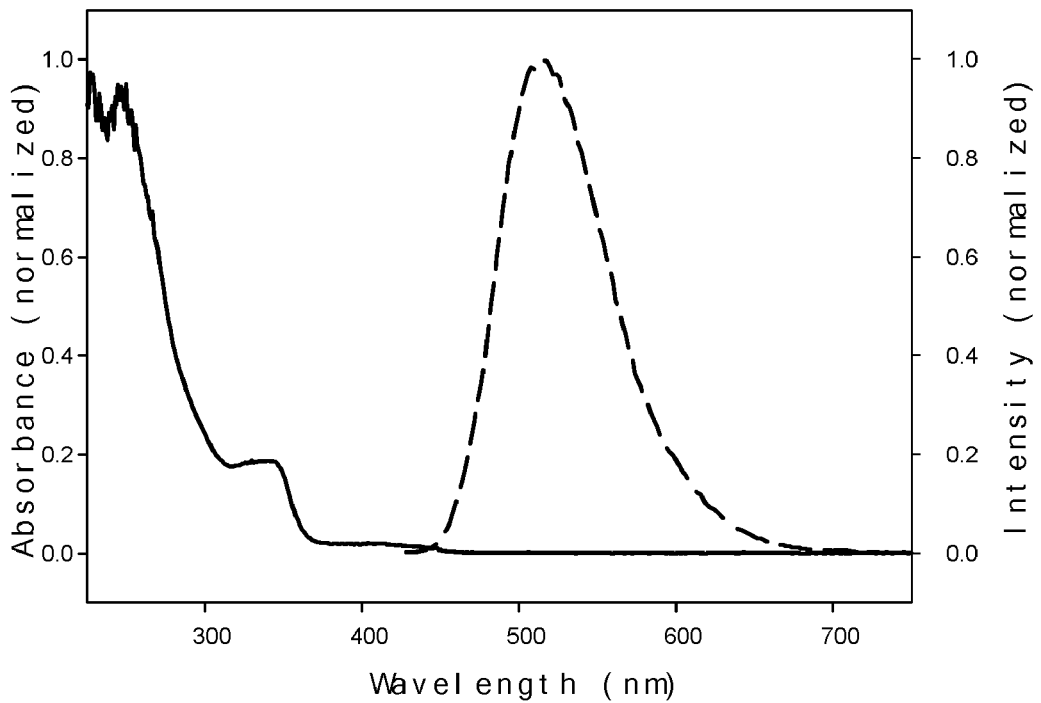
FIG. 3 shows the ultraviolet absorption spectrum and emission spectrum of the synthesized Ir complex dissolved in methylene chloride according to the example 25 of the present invention.

BPI in example 2 is used as the ligand (L). The complex II-2 is prepared according to the steps in example 23. The yield is 68%. FIG. 3 shows the ultraviolet absorption spectrum and emission spectrum of the II-2 dissolved in methylene chloride. The emitting light is green and its wavelength is 514 nm. $^1$H NMR (400 MHz, CDCl$_3$): δ 8.20 (d, 1 H, J=8.0 Hz), 7.95 (d, 1 H, J=8.0 Hz), 7.76 (t, 1 H, J=8.0 Hz), 7.36-7.33 (m, 5 H), 7.24-7.21 (m, 2 H), 7.14-7.05 (m, 6 H), 6.91 (d, 2 H, J=8.0 Hz), 6.82 (d, 3 H, J=8.0 Hz), 6.79-6.76 (m, 3 H), 6.36-6.41 (m, 2 H), 4.99-4.95 (m, 4 H). HRMS (FAB) m/z: calculated value $C_{40}H_{30}F_8IrN_8$ 872.2175; experimental value 872.2181.

Example 26

Ir Complex I-1: pbi$_2$Ir(tfpytz)

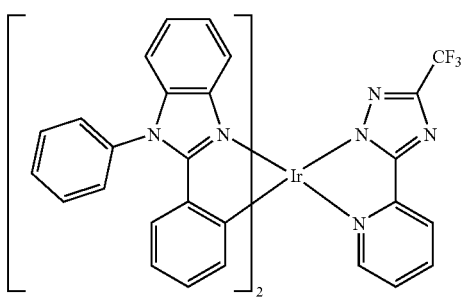

Figure 4:
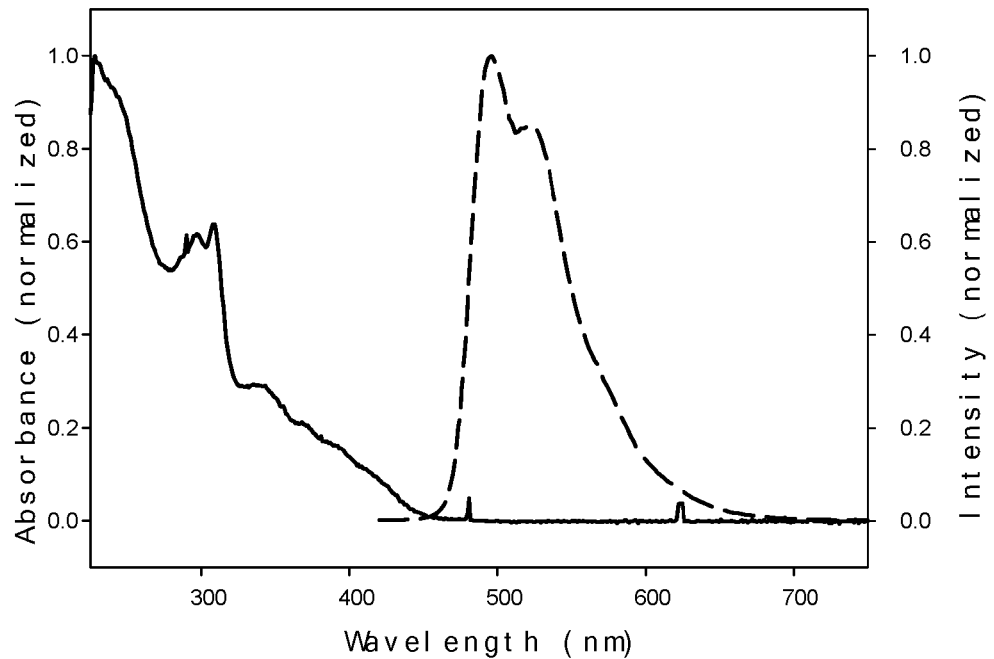
FIG. 4 shows the ultraviolet absorption spectrum and emission spectrum of the synthesized Ir complex dissolved in methylene chloride according to the example 26 of the present invention.

PBI in example 3 is used as the ligand (L). The complex I-1 is prepared according to the steps in example 23. The yield is 69%. FIG. 4 shows the ultraviolet absorption spectrum and emission spectrum of the I-1 dissolved in methylene chloride. The emitting light is green and its wavelength is 496, 525 nm. $^1$H NMR (400 MHz, CDCl$_3$): δ 8.24 (d, 1 H, J=8.0 Hz), 7.98 (d, 1 H, J=8.0 Hz), 7.83 (t, 1 H, J=8.0 Hz), 7.73-7.62 (m, 7 H), 7.52-7.49 (m, 3 H), 7.20-7.14 (m, 3 H), 7.12-6.97 (m, 3 H), 6.88-6.84 (m, 1 H), 6.77-6.73 (m, 2 H), 6.71-6.66 (m, 5 H), 6.53 (d, 1 H, J=8.0 Hz), 6.21 (d, 1 H, J=8.0 Hz), 5.78 (d, 1 H, J=8.0 Hz). HRMS (FAB) m/z: calculated value $C_{46}H_{30}F_3IrN_8$ 944.2175; experimental value 944.2178.

Example 27

Ir Complex V-1: (mnq)$_2$Ir(tfpytz)

Figure 5:
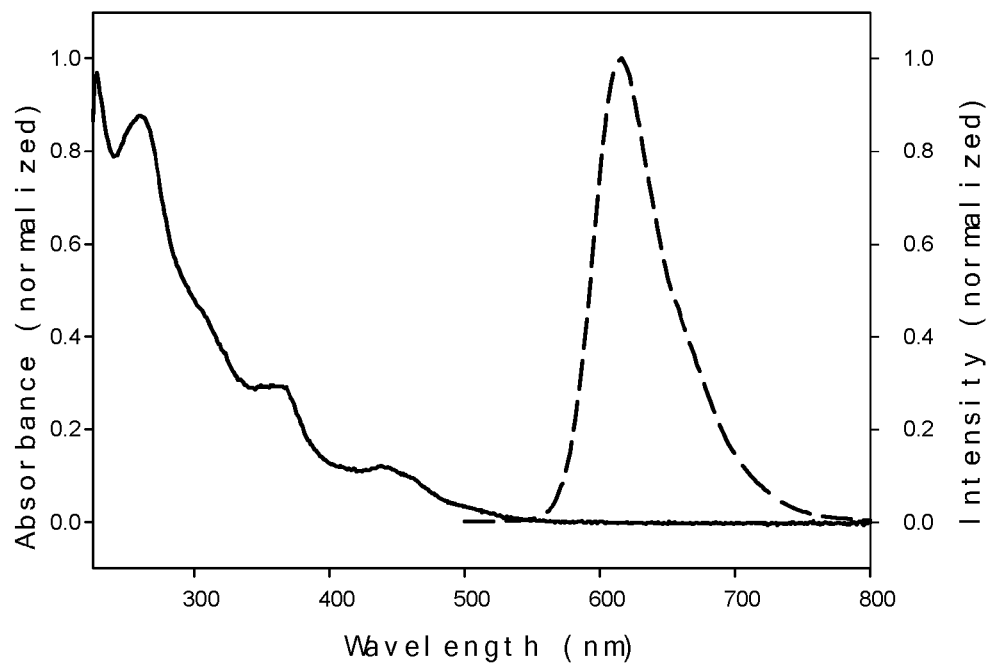
FIG. 5 shows the ultraviolet absorption spectrum and emission spectrum of the synthesized Ir complex dissolved in methylene chloride according to the example 27 of the present invention.

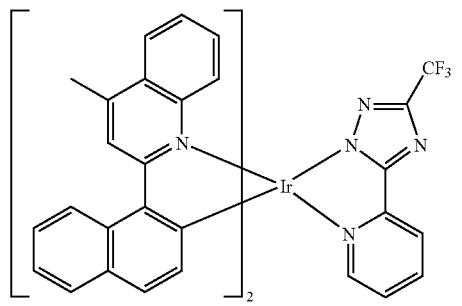

mnq in example 4 is used as the ligand (L). The complex V-1 is prepared according to the steps in example 23. The yield is 75%. FIG. 5 shows the ultraviolet absorption spectrum and emission spectrum of the V-1 dissolved in methylene chloride. The emitting light is red and its wavelength is 616 nm. $^1$H NMR (500 MHz, CDCl$_3$): δ 8.73 (d, 1 H, J=8.5 Hz), 8.58 (d, 1 H, J=9.0 Hz), 8.51 (s, 1 H), 8.37 (s, 1 H), 8.15 (d, 1 H, J=9.0 Hz), 7.95 (m, 1 H), 7.93-7.72 (m, 3 H), 7.66-7.60 (m, 2 H), 7.56-7.49 (m, 3 H), 7.42-7.41 (m, 1 H), 7.33-7.29 (m, 3 H), 7.23-7.19 (m, 5 H), 6.96 (t, 1 H, J=8.0 Hz), 6.82 (d, 1 H, J=8.0 Hz), 6.71 (t, 1 H, J=8.0 Hz), 2.87 (s, 3H), 2.8 (s, 3H). HRMS (FAB) m/z: calculated value $C_{48}H_{32}F_3IrN_6$ 942.2270; experimental value 942.2274.

Example 28

Synthesis of Ir Complex (L)$_2$Ir(pytz)

The synthesis reaction is shown as the following:

2.2 mmol of the compound selected from examples 1~7 is dissolved in 10 ml of 2-ethoxyethanol and then 1 mmol of iridium trichloride hydrate and 3 ml of water are added. The mixture is stirred at 120° C. under nitrogen environment for 12 hrs and then cooled to the room temperature. The precipitation is collected. After washed by ethanol and acetone and dried under vacuum, the cyclometalated Ir(III)-μ-chloro-bridged dimer is obtained. 1 mmol of the dimer, 5 mmol of pytz, and 10 mmol of sodium carbonate are dissolved in 15 ml of 2-ethoxyethanol. The mixture is refluxed under nitrogen environment at 120° C. for 12 hrs. After cooled to the room temperature, 2-ethoxyethanol is removed by distillation and the remained substance is dissolved in methylene chloride. Sodium carbonate is then removed by filtration. The solution is then concentrated under vacuum and then the remained substance is purified by silicone chromatographic column using methylene chloride and n-hexane as the eluent. The Ir complex is further purified by sublimation at 200~220° C. with a pressure of $4 \times 10^{-3}$ Pa before used in the device fabrication.

Example 29

Ir Complex II-3: mpi$_2$Ir(pytz)

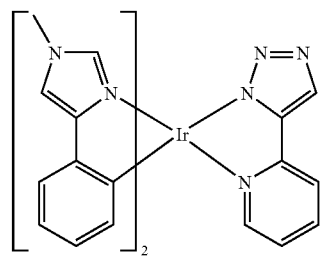

Figure 6:
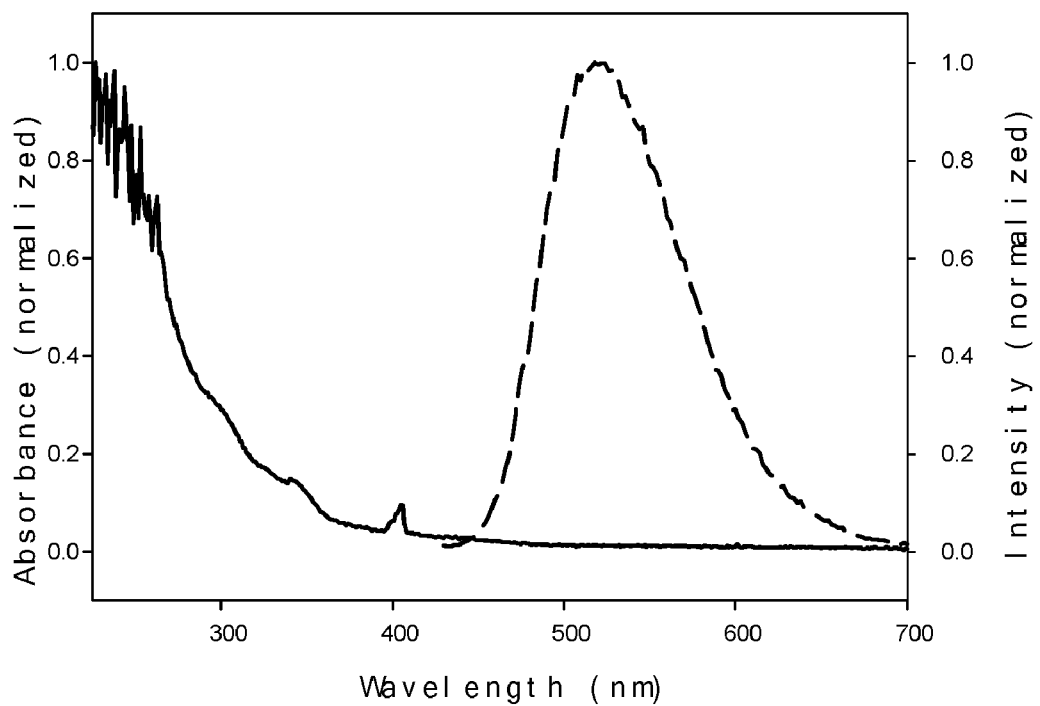
FIG. 6 shows the ultraviolet absorption spectrum and emission spectrum of the synthesized Ir complex dissolved in methylene chloride according to the example 29 of the present invention.

MPI in example 1 is used as the ligand (L). The complex II-3 is prepared according to the steps in example 28. The yield is 70%. FIG. 6 shows the ultraviolet absorption spectrum and emission spectrum of the II-3 dissolved in methylene chloride. The emitting light is green and its wavelength is 518 nm. $^1$H NMR (500 MHz, d-DMSO): δ 8.05 (d, 1 H, J=7.6 Hz), 7.92 (d, 1 H, J=7.8 Hz), 7.85 (t, 1 H, J=7.1 Hz), 7.43 (d, 2 H, J=7.6 Hz), 7.38-7.20 (m, 4 H), 6.89-6.63 (m, 5 H), 6.52 (t, 1 H, J=7.4 Hz), 6.06 (d, 1 H, J=7.6 Hz), 6.04 (d, 1 H, J=7.5 Hz), 3.86 (s, 3H). HRMS (FAB) m/z: calculated value $C_{27}H_{23}IrN_8$ 652.1675; experimental value 652.1673.

Example 30

Ir Complex II-4: bpi$_2$Ir(pytz)

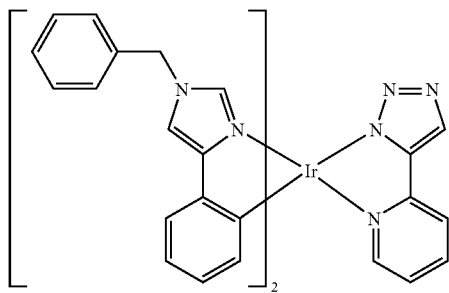

II-4

Figure 7:
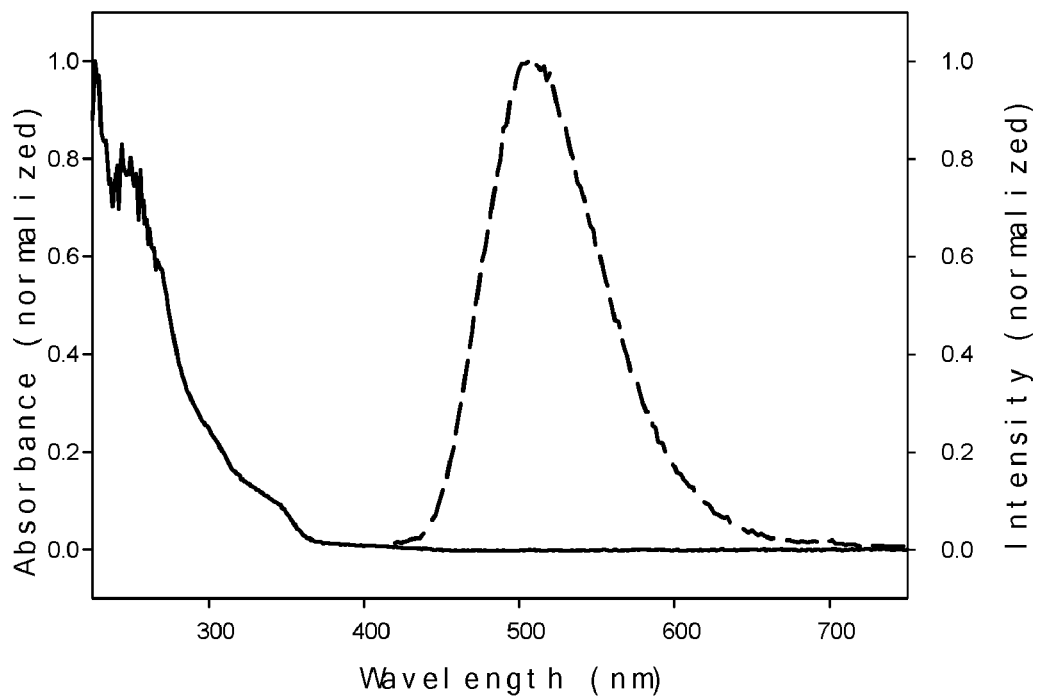
FIG. 7 shows the ultraviolet absorption spectrum and emission spectrum of the synthesized Ir complex dissolved in methylene chloride according to the example 30 of the present invention.

BPI in example 2 is used as the ligand (L). The complex II-4 is prepared according to the steps in example 28. The yield is 75%. FIG. 7 shows the ultraviolet absorption spectrum and emission spectrum of the II-4 dissolved in methylene chloride. The emitting light is green and its wavelength is 506 nm. $^1$H NMR (500 MHz, CDCl$_3$): δ 7.93 (s, 1 H), 7.76 (s, 1 H), 7.65 (s, 1 H), 7.32-7.29 (m, 5 H), 7.20-7.16 (m, 4 H), 7.10-7.00 (m, 4 H), 6.96-6.92 (m, 2 H), 6.85-6.81 (m, 1 H), 6.79-6.78 (m, 2 H), 6.73-6.71 (m, 2 H), 6.71-6.70 (m, 2 H), 6.40-6.35 (m, 2 H), 5.00-4.68 (m, 4 H). HRMS (FAB) m/z: calculated value $C_{39}H_{31}IrN_8$ 804.2301; experimental value 804.2306.

Example 31

Ir Complex I-2: pbi$_2$Ir(pytz)

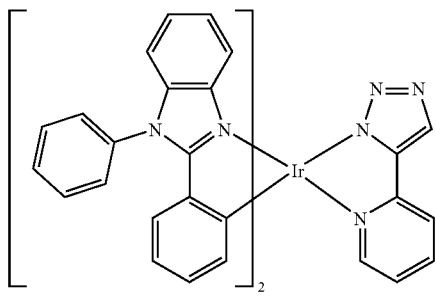

I-2

Figure 8:
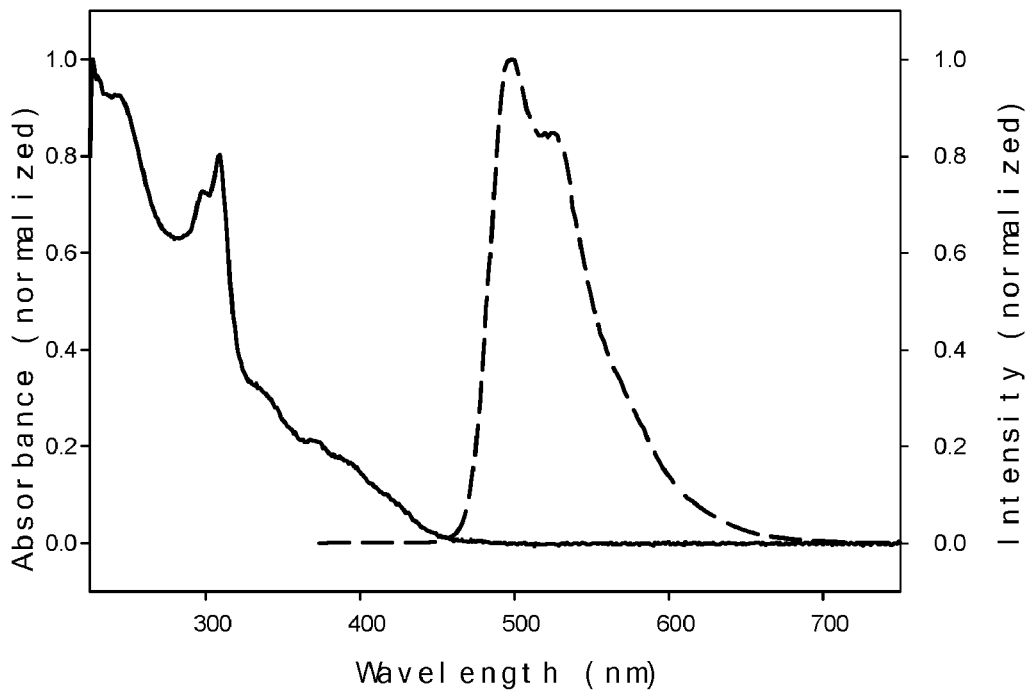
FIG. 8 shows the ultraviolet absorption spectrum and emission spectrum of the synthesized Ir complex dissolved in methylene chloride according to the example 31 of the present invention.

PBI in example 3 is used as the ligand (L). The complex I-2 is prepared according to the steps in example 28. The yield is 69%. FIG. 8 shows the ultraviolet absorption spectrum and emission spectrum of the I-2 dissolved in methylene chloride. The emitting light is green and its wavelength is 498 nm. $^1$H NMR (500 MHz, CDCl$_3$): δ 8.23 (s, 1 H), 7.94 (d, 1 H, J=8.0 Hz), 7.78-7.5 (m, 2 H), 7.68-7.62 (m, 7 H), 7.51-7.20 (m, 3 H), 7.14-6.97 (m, 6 H) 6.84 (t, 1 H, J=8.0 Hz), 6.74-6.53 (m, 8 H), 6.12 (d, 1 H, J=8.5 Hz), 5.84 (d, 1 H, J=8.5 Hz). HRMS (FAB) m/z: calculated value $C_{45}H_{31}IrN_8$ 876.2301; experimental value 876.2304.

Example 32

Ir Complex V-2: (mnq)$_2$Ir(pytz)

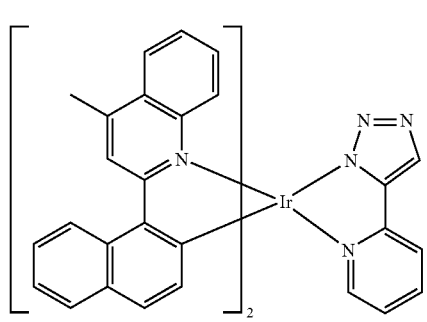

Figure 9:
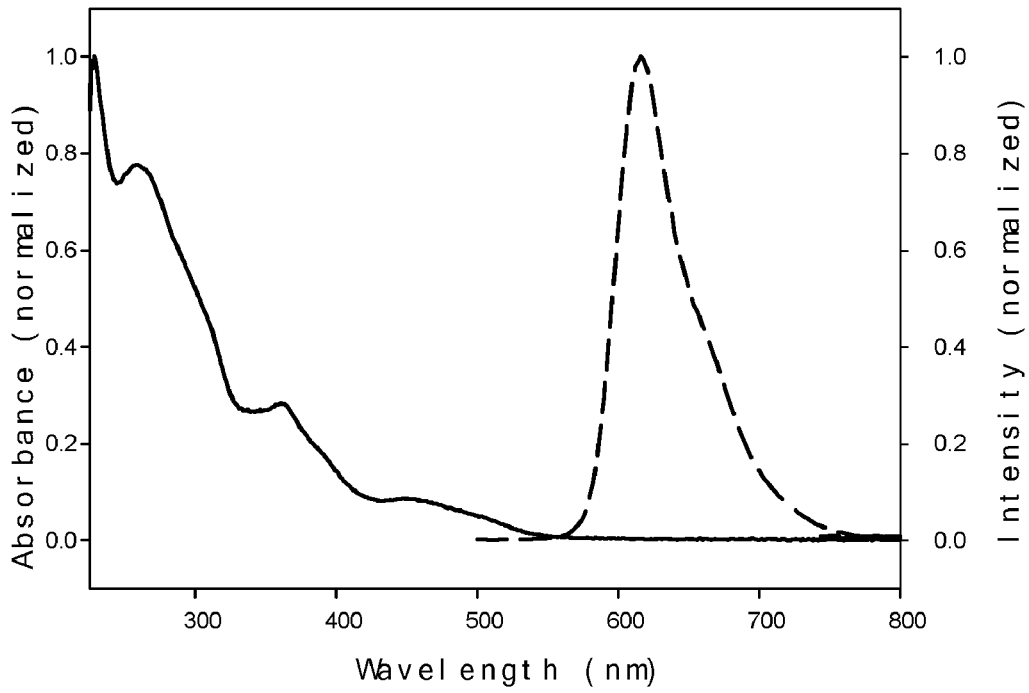
FIG. 9 shows the ultraviolet absorption spectrum and emission spectrum of the synthesized Ir complex dissolved in methylene chloride according to the example 32 of the present invention.

V-2 mnq in example 4 is used as the ligand (L). The complex V-2 is prepared according to the steps in example 28. The yield is 74%. FIG. 9 shows the ultraviolet absorption spectrum and emission spectrum of the V-2 dissolved in methylene chloride. The emitting light is red and its wavelength is 616 nm. $^1$H NMR (500 MHz, CDCl$_3$): δ 8.72 (d, 1H, J=7.5 Hz), 8.65 (d, 1H, J=7.8 Hz), 8.49 (d, 1 H, J=7.6 Hz), 8.05 (d, 1H, J=8.0 Hz), 7.77-7.31 (m, 15H), 7.21-6.92 (m, 8H), 2.25 (s, 3H). HRMS (FAB) m/z: calculated value $C_{47}H_{33}IrN_6$ 874.2396; experimental value 874.2397.

Example 33

Ir Complex III-1: ppy$_2$Ir(pytz)

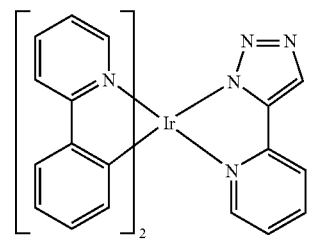

III-1

Figure 10:
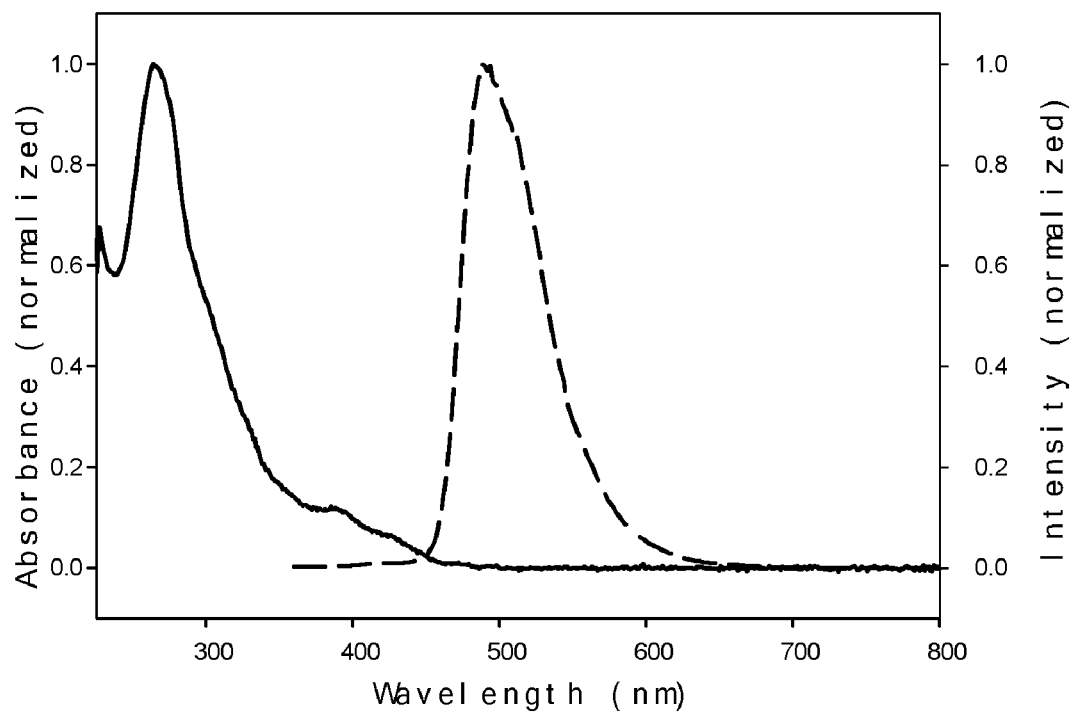
FIG. 10 shows the ultraviolet absorption spectrum and emission spectrum of the synthesized Ir complex dissolved in methylene chloride according to the example 33 of the present invention.

Phenylpyridine (PPY) is used as the ligand (L). The complex III-1 is prepared according to the steps in example 28. The yield is 80%. FIG. 10 shows the ultraviolet absorption spectrum and emission spectrum of the III-1 dissolved in methylene chloride. The emitting light is green and its wavelength is 488 nm. $^1$H NMR (400 MHz, CDCl$_3$): δ 8.18 (s, 1 H), 7.85-7.79 (m, 3 H), 7.77-7.69 (m, 3 H), 7.63-7.61 (m, 5 H), 7.51-7.50 (m, 1 H), 6.96 (t, 2 H, J=7.2 Hz), 6.88 (t, 2 H, J=6.4 Hz), 6.83-6.81 (m, 2 H), 6.39-6.34 (m, 2 H). HRMS (EI) m/z: calculated value $C_{29}H_{21}IrN_6$ 646.1457; experimental value 646.1461.

Example 34

Synthesis of Ir Complex (L)₂Ir(pydmi)

The synthesis reaction is shown as the following:
2.2 mmol of the compound selected from examples 1~7 is dissolved in 10 ml of 2-ethoxyethanol and then 1 mmol of iridium trichloride hydrate and 3 ml of water are added. The mixture is stirred at 120° C. under nitrogen environment for 12 hrs and then cooled to the room temperature. The precipitation is collected. After washed by ethanol and acetone and dried under vacuum, the cyclometalated Ir(III)-μ-chloro-bridged dimer is obtained. 1 mmol of the dimer, 5 mmol of pydmi, and 10 mmol of sodium carbonate are dissolved in 15 ml of 2-ethoxyethanol. The mixture is refluxed under nitrogen environment at 120° C. for 12 hrs. After cooled to the room temperature, 2-ethoxyethanol is removed by distillation and the remained substance is dissolved in methylene chloride. Sodium carbonate is then removed by filtration. The solution is then concentrated under vacuum and then the remained substance is purified by silicone chromatographic column using methylene chloride and n-hexane as the eluent. The Ir complex is further purified by sublimation at 200~220° C. with a pressure of 4×10⁻³ Pa before used in the device fabrication.

Example 35

Ir Complex I-3: pbi₂Ir(pydmi)

I-3

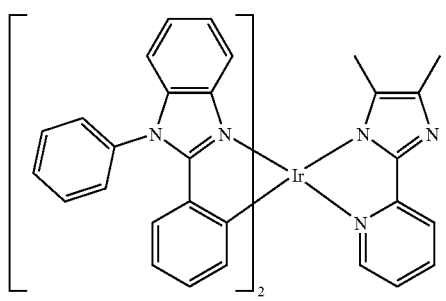

Figure 11:
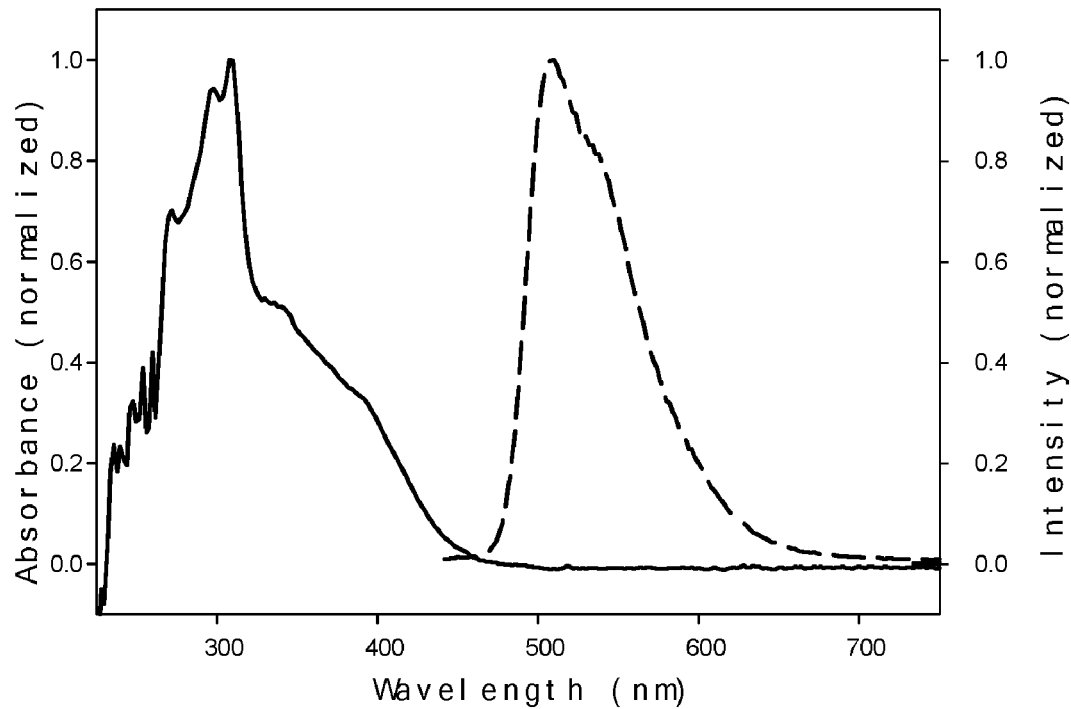
FIG. 11 shows the ultraviolet absorption spectrum and emission spectrum of the synthesized Ir complex dissolved in methylene chloride according to the example 35 of the present invention.

PBI in example 3 is used as the ligand (L). The complex I-3 is prepared according to the steps in example 34. The yield is 72%. FIG. 11 shows the ultraviolet absorption spectrum and emission spectrum of the I-3 dissolved in methylene chloride. The emitting light is green and its wavelength is 510 nm. ¹H NMR (500 MHz, CDCl₃): δ 8.06 (br, 1 H), 7.74-7.70 (m, 1 H), 7.67-7.50 (m, 10 H), 7.16-7.10 (m, 3 H), 7.09-6.98 (m, 3 H), 6.85 (t, 1 H, J=7.6 Hz), 6.78-6.50 (m, 9 H), 6.28 (d, 1 H, J=7.8 Hz), 6.07-6.10 (m, 1 H), 2.26 (s, 3 H), 1.49 (s, 3 H). HRMS (FAB) m/z: calculated value C₄₈H₃₆IrN₇ 903.2661; experimental value 903.2664.

Example 36

Ir Complex V-3: (mnq)₂Ir(pydmi)

V-3

Figure 12:
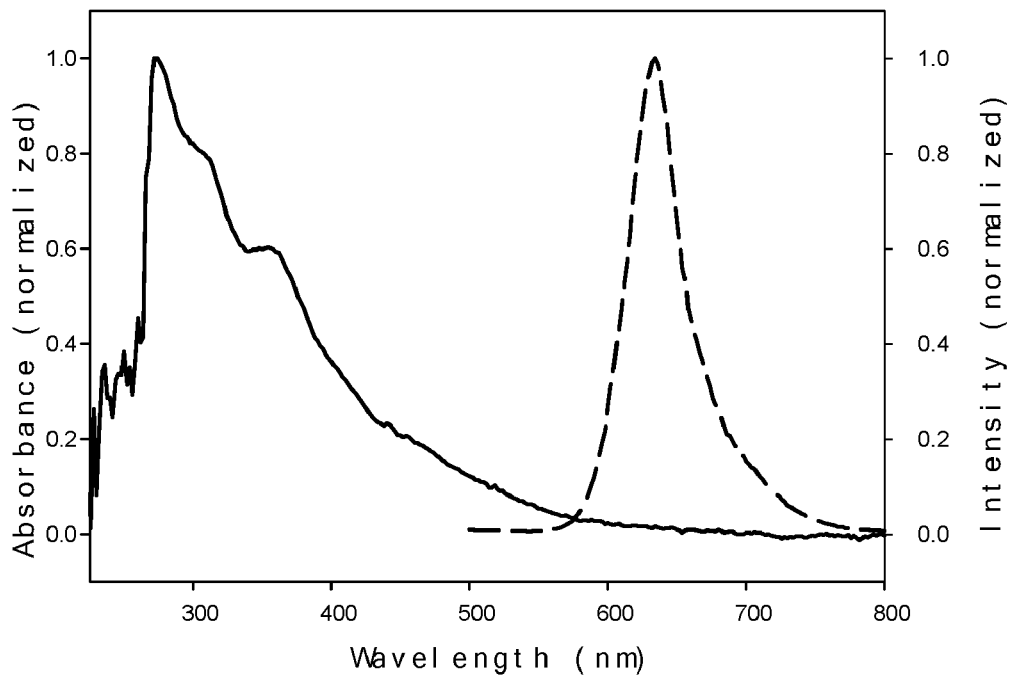
FIG. 12 shows the ultraviolet absorption spectrum and emission spectrum of the synthesized Ir complex dissolved in methylene chloride according to the example 36 of the present invention.

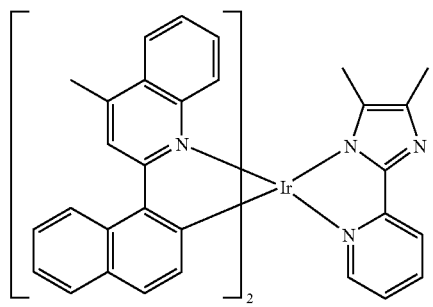

mnq in example 4 is used as the ligand (L). The complex V-3 is prepared according to the steps in example 34. The yield is 75%. FIG. 12 shows the ultraviolet absorption spectrum and emission spectrum of the V-3 dissolved in methylene chloride. The emitting light is red and its wavelength is 634 nm. ¹H NMR (400 MHz, CDCl₃): δ 8.61 (d, 1 H, J=8.8 Hz), 8.53 (d, 1 H, J=8.4 Hz), 8.40 (s, 1 H), 8.37 (s, 1 H), 7.82-7.77 (m, 2 H), 7/71-7.65 (m, 3 H), 7.55-7.47 (m, 3 H), 7.38-7.27 (m, 5 H), 7.24-7.2 (m, 3 H), 7.14 (d, 1 H, J=8.4 Hz), 7.10-7.07 (m, 3 H), 7.00 (d, 1 H, J=8.0 Hz), 6.88 (d, 1 H, J=8.4 Hz), 6.80 (t, 1 H, J=8.0 Hz), 2.90 (s, 3 H), 2.85 (s, 3 H), 2.15 (s, 3 H), 1.24 (s, 3 H). HRMS (FAB) m/z: calculated value C₅₀H₃₈IrN₅ 901.2756; experimental value 901.2759.

Example 37

Ir Complex III-2: ppy₂Ir(pydmi)

III-2

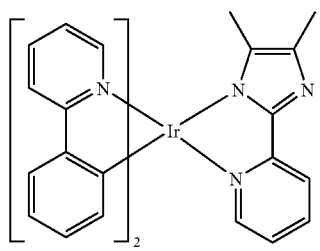

Figure 13:
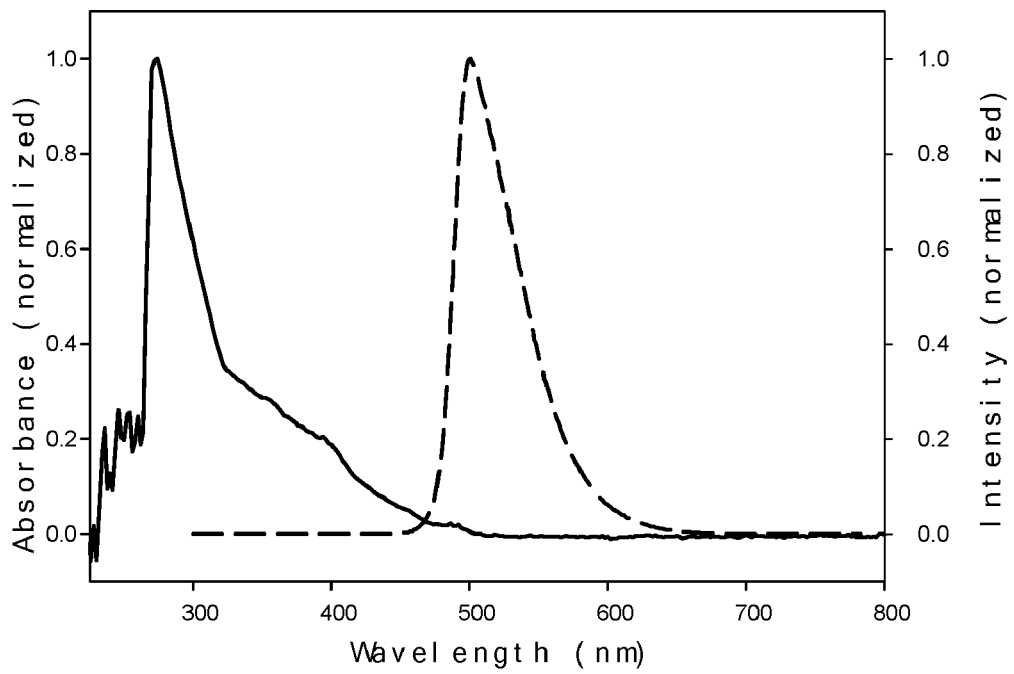
FIG. 13 shows the ultraviolet absorption spectrum and emission spectrum of the synthesized Ir complex dissolved in methylene chloride according to the example 37 of the present invention.

Phenylpyridine (ppy) is used as the ligand (L). The complex III-2 is prepared according to the steps in example 34. The yield is 80%. FIG. 13 shows the ultraviolet absorption spectrum and emission spectrum of the III-2 dissolved in methylene chloride. The emitting light is green and its wavelength is 500 nm. ¹H NMR (500 MHz, CDCl₃): δ 9.22 (d, 1 H, J=8.0 Hz), 8.12 (s, 1 H), 7.83-7.45 (m, 7 H), 6.90-6.70 (m, 5 H), 6.54 (t, 2 H, J=8.0 Hz), 6.31 (m, 2 H), 5.91 (d, 2 H, J=7.6 Hz), 2.17 (s, 3 H), 1.37 (s, 3 H). HRMS (EI) m/z: calculated value C₃₂H₂₆IrN₅ 673.1817; experimental value 673.1821.

Examples 38~51

Fabricating OLED Device

OLED devices are fabricated by using the Ir complex synthesized according to the above examples of the present invention. The device is fabricated by the following method. Glass is used as the substrate. On the substrate, a positive electrode, a hole-injection layer (maybe omitted), a hole-transporting layer, an emitter, a hole-blocking layer (maybe omitted), an electron-transporting layer, an electron-injection layer (KF; or maybe omitted), and a negative electrode are sequentially formed. The positive electrode is conducting indium-tin-oxide (ITO) and its thickness is about 100 nm. The emitter is formed by doping the phosphorescent Ir complex as a dopant into a host compound. Before depositing these organic layers, the ITO glass is cleaned by detergent and organic solvent and treated by a UV-ozone cleaner.

The material for the hole-injection layer used in the device according to the present invention can have the following structural formula group G1, comprising CuPc, m-MTDATA, and 2-TNATA.

Structural formula group G1

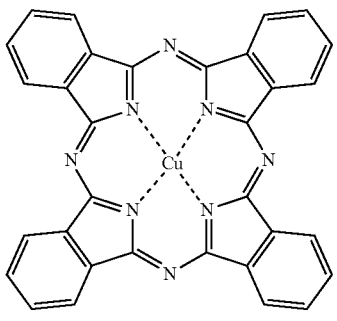

CuPc

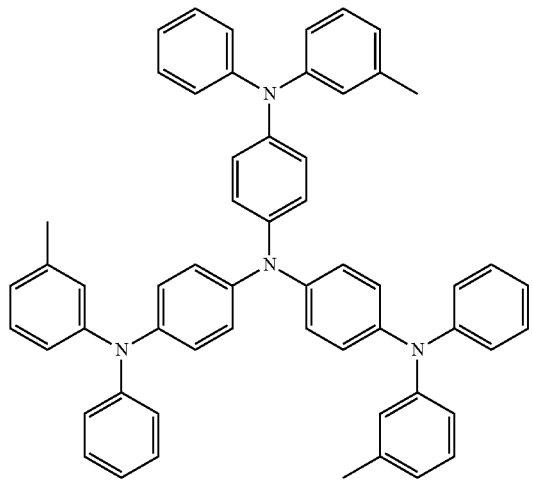

m-MTDATA

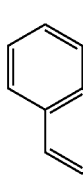

2-TNATA

The material for the hole-transporting layer used in the device according to the present invention is of aniline compound and can have the following structural formula group G2, comprising NPB, TPD, NCB, PPB, TCTA, MPMP, and HMTPD.

Structural formula group G2

NPB

TPD

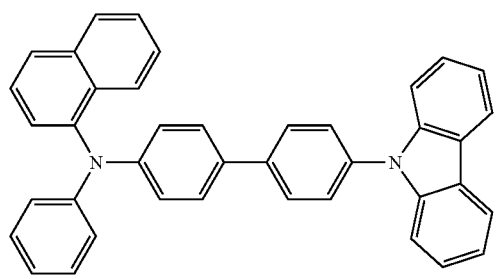
NCB
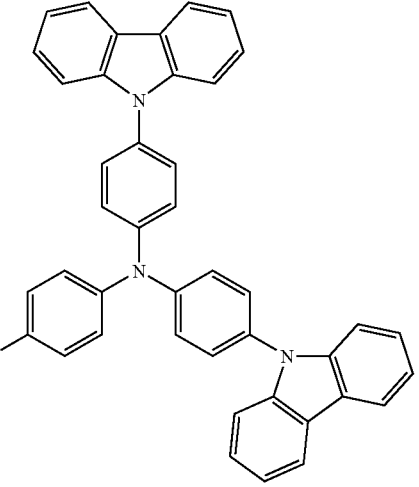
TCTA
The host compound can be TCTA in the above structural formula group G2 or CBP, CCP, mCP, TCB, TCPB in the following structural formula group G3 with the hole transporting capability, or TPBI, TAZ-1, TAZ-2, TAZ-3, PBD in the following structural formula group G3 with the electron transporting capability.
Structural formula group G3
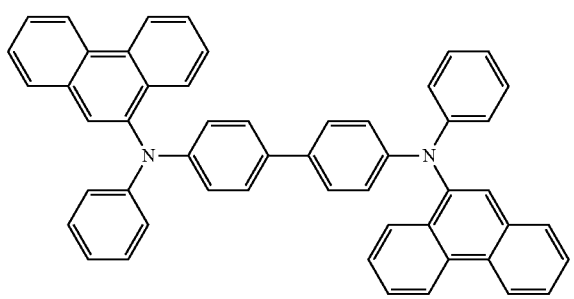
PPB
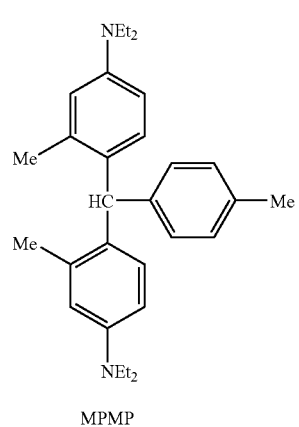
MPMP
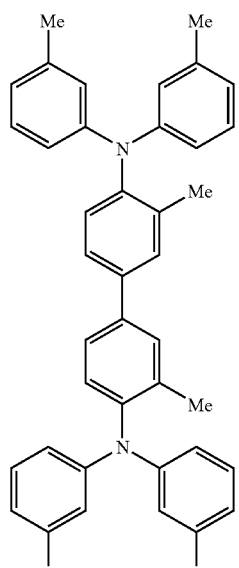
HMTPD
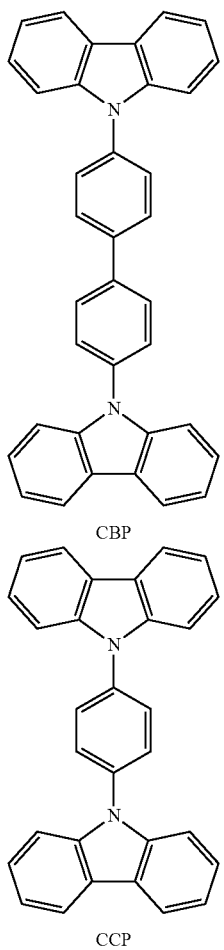
CBP
CCP

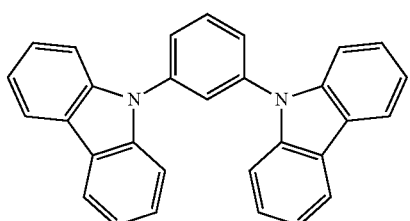

mCP

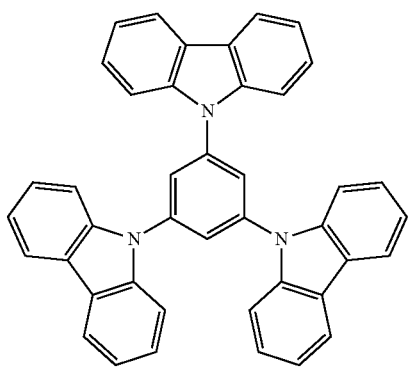

TCB

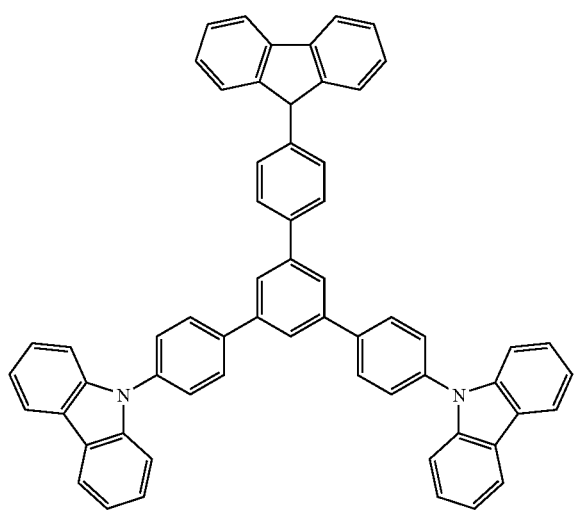

TCPB

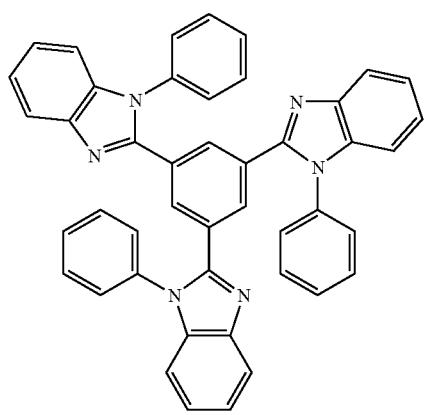

TPBI

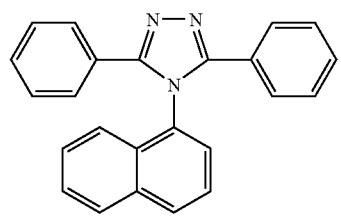

TAZ-1

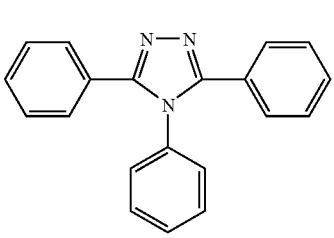

TAZ-3

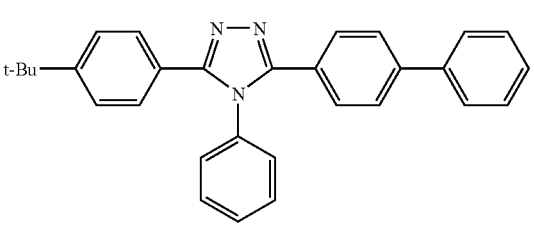

TAZ-2

PBD

The hole-blocking layer can be TPBI in the above structural formula group G3 or BCP, BAlq, PAlq, and SAlq in the following structural formula group G4. The material for the electron-transporting layer can be TPBI, TAZ-1, TAZ-2, TAZ-3, PBD in the above structural formula group G3, or Alq$_3$ or DPA in the following structural formula group G4.

Structural formula group G4

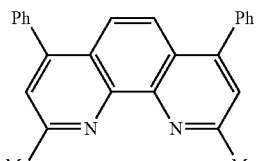

BCP

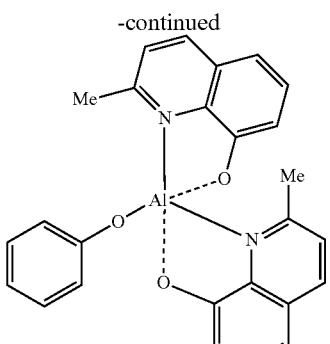

PAlq

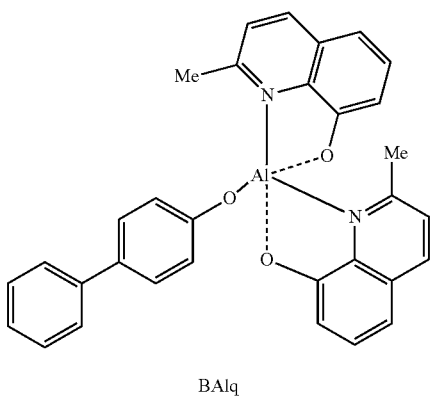

BAlq

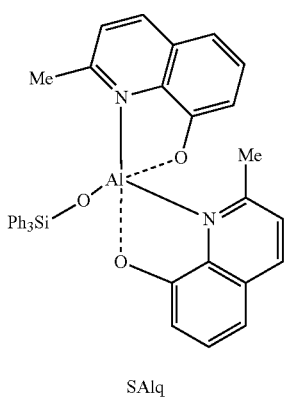

SAlq

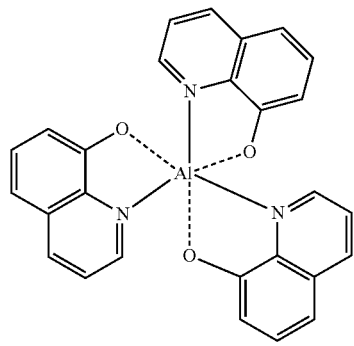

Alq₃

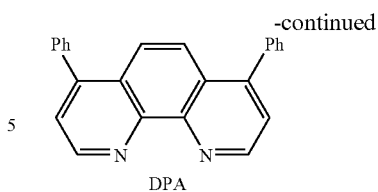

DPA

In the structural formula groups G2~G4, Ph represents phenyl, Me represents methyl, Et represents ethyl, and Bu represents butyl.

In the device fabrication, during the deposition of organic compounds, phosphorescent Ir complexes and metals, the pressure of the chamber is about less than $5 \times 10^{-6}$ torr. The deposition rate for the organic compounds is about 1.5~2.5 Å/sec. The deposition rate for the phosphorescent Ir complexes is about 0.05~0.2 Å/sec. The deposition rate for potassium fluoride is about 0.5 Å/sec. The thickness of the hole-injection layer is about 10~15 nm. The thickness of the hole-transporting layer is between 25~50 nm. The thickness of the hole-blocking layer is between 10~20 nm. The thickness of the electron-transporting layer is between 10~50 nm. The thickness of the electron-injection layer (KF) is about 0.5 nm. The negative electrode is Mg—Ag alloy. The deposition rate for Mg is 5 Å/sec. The deposition rate for Ag is 0.5 Å/sec. Mg and Ag with a ratio of 10:1 are co-deposited and the thickness of the film is 55 nm. Finally, Ag is deposited as a protection layer and its thickness is about 100~150 nm. The results of all of the devices (examples 35~51) are shown in Table 1 while the structure of the device is shown in the following:

example 38: TCTA (40)/mpi₂Ir(tfpytz):CBP (6%)(30)/BCP (15)/Alq (30)/Mg:Ag;

example 39: TCTA (40)/bpi₂Ir(tfpytz):CBP (3.67%)(30)/BCP (15)/Alq;

example 40: NPB (40)/pbi₂Ir(pytz):CBP (5.98%)(30)/BCP (15)/Alq (30)/Mg:Ag;

example 41: TCTA (40)/pbi₂Ir(pytz):CBP (5%)(30)/BCP (15)/Alq (30)/Mg:Ag;

example 42: TCTA (40)/pbi₂Ir(pytz):CBP (2.66%)(30)/BCP (15)/Alq (30)/Mg:Ag;

example 43: TCTA (40)/pbi₂Ir(tfpytz):CBP (6%)(30)/BCP (15)/Alq (30)/Mg:Ag;

example 44: TCTA (40)/pbi₂Ir(tfpytz):CBP (3%)(30)/BCP (15)/Alq (30)/Mg:Ag;

example 45: TCTA (40)/pbi₂Ir(tfpytz):CBP (8.63%)(30)/BCP (15)/Alq (30)/Mg:Ag;

example 46: TCTA (40)/pbi₂Ir(pydmi):CBP (7%)(30)/BCP (15)/Alq (30)/Mg:Ag;

example 47: TCTA (40)/pbi₂Ir(pydmi):CBP (5.67%)(30)/BCP (10)/Alq (40)/Mg:Ag;

example 48: TCTA (40)/pbi₂Ir(pydmi):CBP (6.31%)(30)/TPBI (40)/Mg:Ag;

example 49: TCTA (40)/mnq₂Ir(pydmi):CBP (5.33%)(30)/BCP (15)/Alq (30)/Mg:Ag;

example 50: TCTA (40)/ppy₂Ir(pytz):CBP (5%)(30)/BCP (15)/Alq (30)/Mg:Ag; and example 51: TCTA (40)/ppy₂Ir(pydmi):CBP (5.67%)(30)/BCP (15)/Alq (30)/Mg:Ag.

TABLE 1

| Example No. | Threshold voltage (V) | Maximum external quantum efficiency (%) (voltage/Volt) | Maximum luminance (cd/m²) (voltage/Volt) | Maximum efficiency (cd/A) (voltage/Volt) | CIE (8 V) (x, y) | Wavelength at the maximum emission (nm) |
|---|---|---|---|---|---|---|
| 38 | 3.0 | 6.33 (14.0) | 20903 (8.0) | 15.9 (8.0) | (0.20, 0.513) | 502 |
| 39 | 4.7 | 5.66 (9.0) | 12790 (14.0) | 12.6 (9.5) | (0.18, 0.46) | 498 |
| 40 | 3.2 | 5.12 (6.0) | 44109 (12.5) | 14.81 (6.0) | (0.21, 0.58) | 504 |
| 41 | 2.8 | 12.8 (6.0) | 63814 (11.0) | 38.71 (6.0) | (0.25, 0.61) | 504 |
| 42 | 4.3 | 8.54 (6.5) | 45770 (12.0) | 25.84 (4.5) | (0.26, 0.60) | 504 |
| 43 | 4.2 | 3.84 (6.5) | 24710 (11.0) | 10.55 (6.5) | (0.23, 0.58) | 498 |
| 44 | 3.3 | 2.13 (7.0) | 16992 (11.0) | 5.74 (7.0) | (0.22, 0.57) | 498 |
| 45 | 3.6 | 5.05 (7.0) | 29302 (11.0) | 13.84 (7.0) | (0.23, 0.58) | 498 |
| 46 | 3.6 | 12.41 (7.5) | 49395 (14.5) | 40.03 (7.5) | (0.26, 0.64) | 510 |
| 47 | 3.0 | 18.36 (7.0) | 75917 (14.5) | 60.38 (7.0) | (0.27, 0.64) | 512 |
| 48 | 2.7 | 7.96 (5.0) | 53884 (13.5) | 25.9 (5.0) | (0.30, 0.62) | 510 |
| 49 | 5.2 | 7.02 (8.5) | 15222 (15.5) | 10.33 (8.5) | (0.64, 0.34) | 616 |
| 50 | 3.2 | 13.36 (7.0) | 7.2206 (14.5) | 43.65 (6.5) | (0.22, 0.61) | 508 |
| 51 | 3.1 | 15.54 (6.5) | 38202 (16.5) | 5.56 (8.5) | (0.66, 0.33) | 500 |

From the data shown in Table 1, the phosphorescent Ir complexes according to the present invention as phosphorescent materials can be applied in the OLEDs. The device using these Ir complexes can emit green to red phosphorescence. In addition, the device has the characteristics of high brightness, high current efficiency, and excellent CIE coordinates.

Obviously many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. An organic light emitting diode, comprising:
   a positive electrode formed on a substrate;
   an electroluminescent medium formed on said positive electrode; and
   a negative electrode formed on said electroluminescent medium;
   wherein said electroluminescent medium comprises an emitter and said emitter comprises a phosphorescent Ir complex that comprises the structure shown by a ligand:

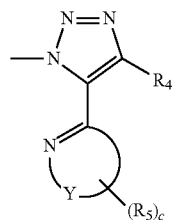

L₂ in which Y is any atomic group that Y and the neighboring N=C form a nitrogen containing heterocyclic ring group (hereinafter referred to as N containing heterocyclic ring group) and c is 0 or any positive integer that depends on said N and Y containing heterocyclic ring group;
said N containing heterocyclic ring group is quinoline, isoquinoline, pyrazine, pyrimidine, pyrrole, pyrazole, imidazole, indole, thiazole, isothiazole, oxazole, isoxazole, benzothiazole, benzoxazole, or phenanthroline;
wherein R₄, or R₅ independently represents a halogen atom, aryl, C1~C20 alkyl, aryl substituted C1~C20 alkyl, C2~C20 alkenyl, C2-C20 alkynyl, halogen substituted C1~C20 alkyl, C1~C20 alkoxyl, C1~C20 substituted amino, C1~C20 acyl, C1-C20 ester, C1~C20 amido, halogen substituted aryl, halogen substituted aralkyl, haloalkyl group substituted aryl, haloalkyl group substituted aralkyl, cyano, or nitro group; and
said aryl group represents phenyl, naphthyl, diphenyl, anthryl, pyrenyl, phenanthryl, or fluorenyl group.

2. The organic light emitting diode according to claim 1, wherein said Ir complex comprises one structure selected from the following formula I, II, III, IV, V, or VI;

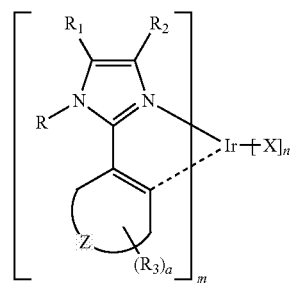

I

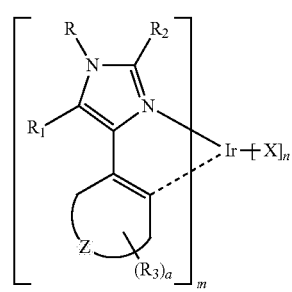

II

-continued

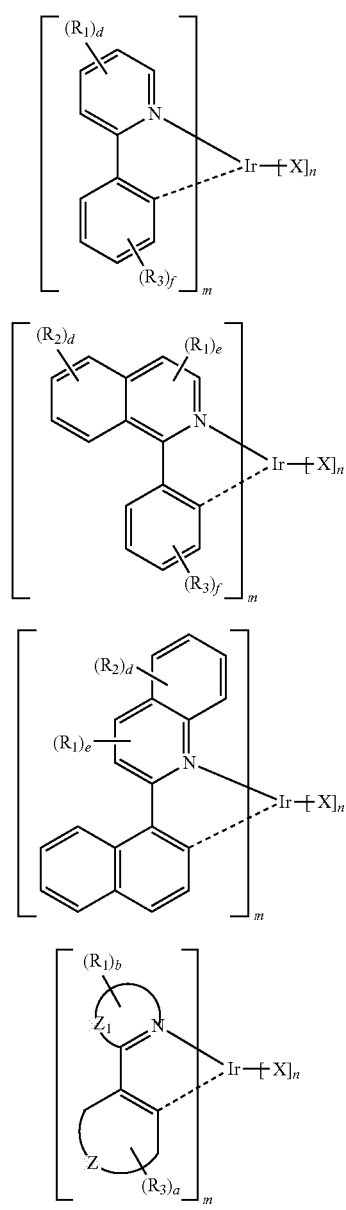

in which X is; m is 0, 1, or 2, n is a positive integer, and m+n=3;

R, $R_1$, $R_2$, or $R_3$ independently represents a hydrogen atom, halogen atom, aryl, C1~C20 alkyl, aryl substituted C1~C20 alkyl, C2~C20 alkenyl, C2-C20 alkynyl, halogen substituted C1~C20 alkyl, C1~C20 alkoxyl, C1~C20 substituted amino, C1~C20 acyl, C1-C20 ester, C1~C20 amido, halogen substituted aryl, halogen substituted aralkyl, haloalkyl group substituted aryl, haloalkyl group substituted aralkyl, cyano, or nitro group;

Z is any atomic group that comprises aryl, cyclene or heterocyclic group;

$Z_1$ is any atomic group that $Z_1$ and the neighboring C=N form a heterocyclic ring group; and a is 0 or any positive integer that depends on said Z containing aryl, cyclene or heterocyclic group;

b is 0 or any positive integer that depends on said N (nitrogen atom) and $Z_1$ containing heterocyclic ring group;

d is a positive integer from 0 to 4;

e is a positive integer from 0 to 2;

f is a positive integer from 0 to 4;

said aryl group of Z, R, $R_1$ $R_2$, or $R_3$ independently represents phenyl, naphthyl, diphenyl, anthryl, pyrenyl, phenanthryl, or fluorenyl group;

said cyclene group comprises cyclohexene, cyclohexadiene, cyclopentene, or cyclopentadiene;

said heterocyclic ring group comprises pyrane, pyrroline, furan, benzofuran, thiophene, benzothiophene, pyridine, quinoline, isoquinoline, pyrazine, pyrimidine, pyrrole, pyrazole, imidazole, indole, thiazole, isothiazole, oxazole, isoxazole, benzothiazole, benzoxazole, phenanthroline or any other heterocyclic ring; and said N (nitrogen atom) containing heterocyclic ring group represents pyridine, quinoline, isoquinoline, pyrazine, pyrimidine, pyrrole, pyrazole, imidazole, indole, thiazole, isothiazole, oxazole, isoxazole, benzothiazole, benzoxazole, or phenanthroline.

3. The organic light emitting diode according to claim 1, wherein said phosphorescent Ir complex comprises one selected from the following

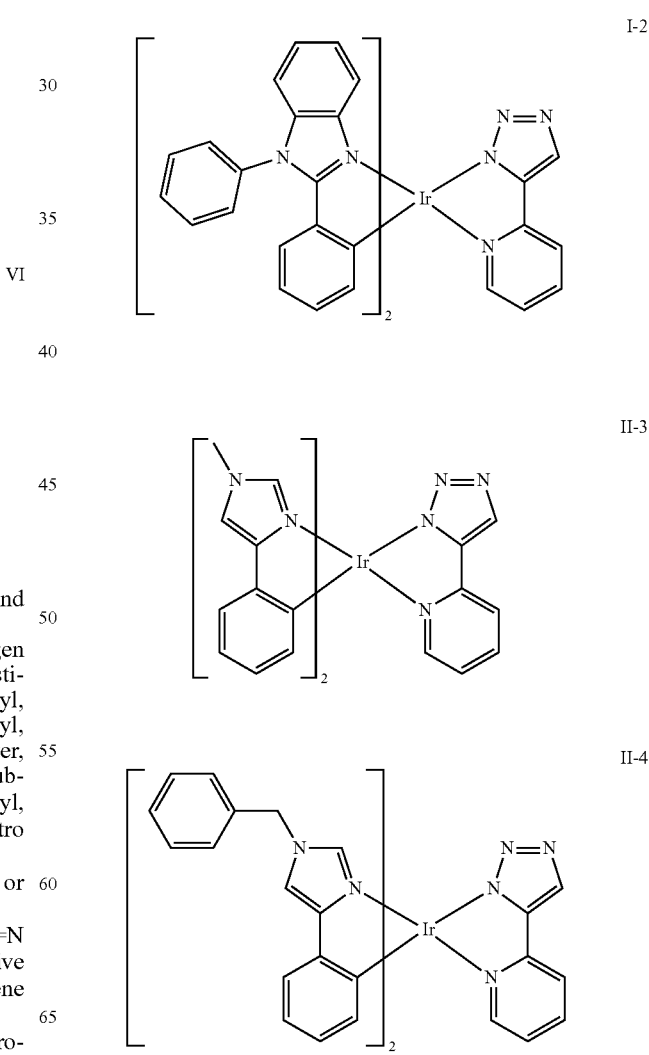

-continued

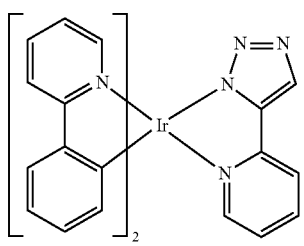
III-1

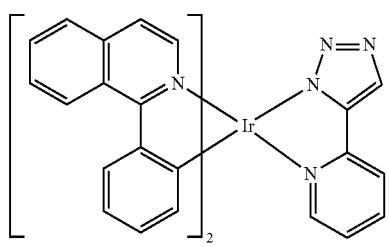
IV-2

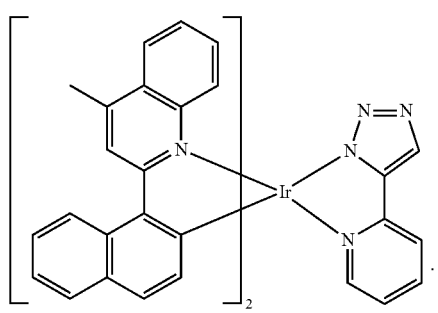
V-2

4. The organic light emitting diode according to claim 2, wherein said emitter produces green to red lights as a voltage is applied on said positive and negative electrodes.

5. The organic light emitting diode according to claim 2, wherein said emitter further comprises a host compound and said Ir complex is doped in said host compound.

6. The organic light emitting diode according to claim 5, wherein said host compound is a hole-transporting compound.

7. The organic light emitting diode according to claim 5, wherein said host compound is an electron-transporting compound.

8. The organic light emitting diode according to claim 6, wherein said hole-transporting compound is

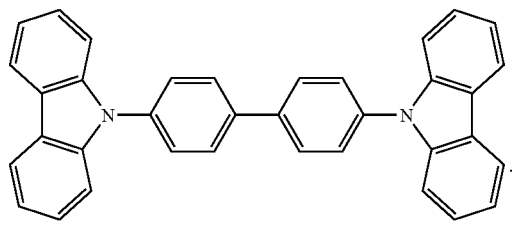

9. The organic light emitting diode according to claim 6, wherein said hole-transporting compound is

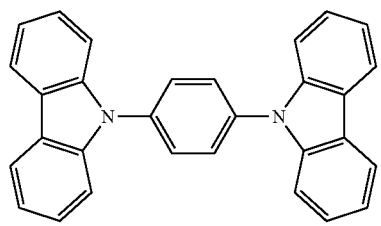

10. The organic light emitting diode according to claim 6, wherein said hole-transporting compound is

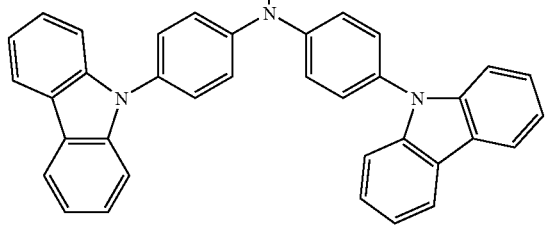

11. The organic light emitting diode according to claim 6, wherein said hole-transporting compound is

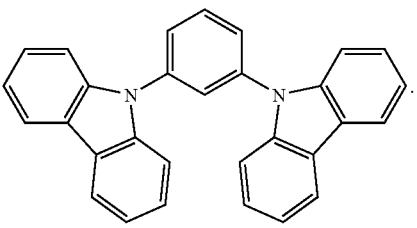

12. The organic light emitting diode according to claim 6, wherein said hole-transporting compound is

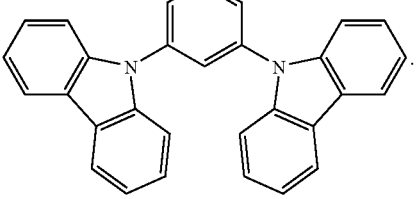

13. The organic light emitting diode according to claim 7, wherein said electron-transporting compound is

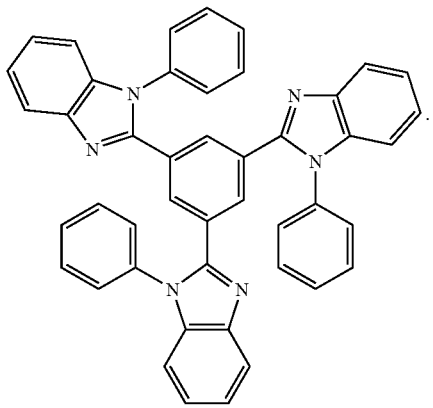

14. The organic light emitting diode according to claim 2, wherein said electroluminescent medium further comprises a hole-transporting layer provided between said positive electrode and said emitter.

15. The organic light emitting diode according to claim 14, wherein said hole-transporting layer comprises a compound having the following structure:

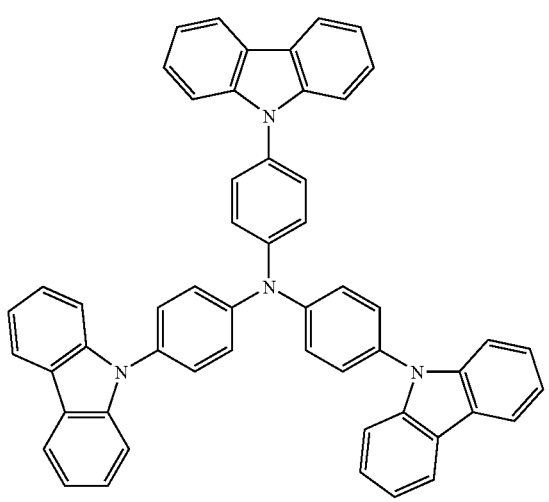

16. The organic light emitting diode according to claim 14, wherein said electroluminescent medium further comprises a hole-injection layer provided between said positive electrode and said hole-transporting layer.

17. The organic light emitting diode according to claim 16, wherein said hole-injection layer comprises a compound having the following structure:

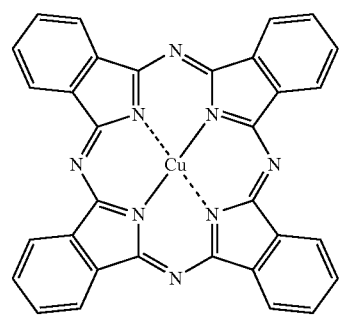

18. The organic light emitting diode according to claim 16, wherein said hole-injection layer comprises a compound having the following structure:

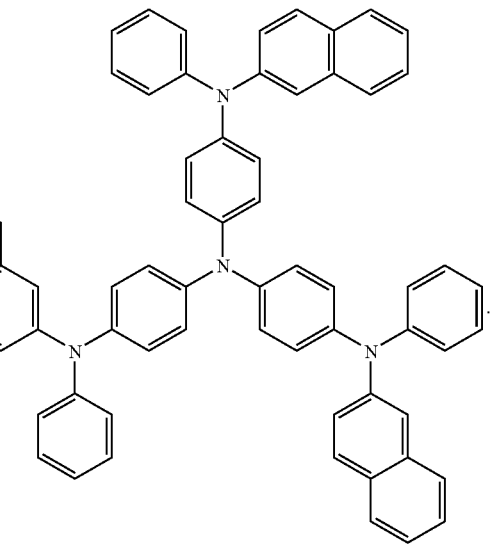

19. The organic light emitting diode according to claim 16, wherein said hole-injection layer comprises a compound having the following structure:

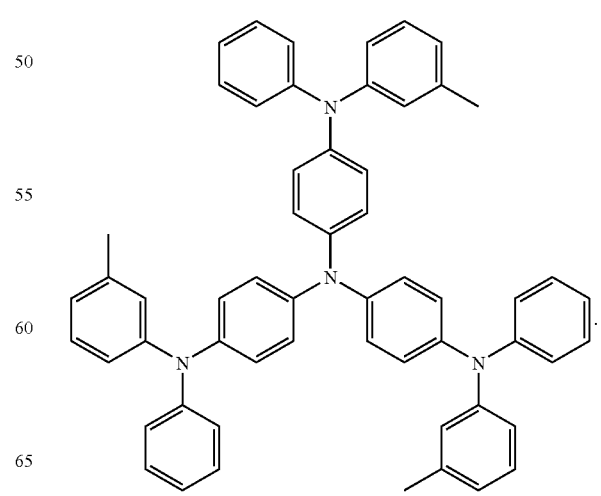

20. The organic light emitting diode according to claim 16, wherein said electroluminescent medium further comprises a hole-blocking layer provided between said negative electrode and said emitter and said hole-blocking layer contacts with said emitter.

21. The organic light emitting diode according to claim 20, wherein said hole-blocking layer comprises a compound having the following structure:

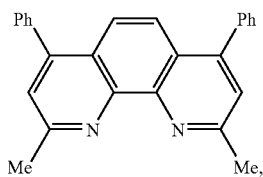

in which Ph is phenyl and Me is methyl.

22. The organic light emitting diode according to claim 20, wherein said hole-blocking layer comprises a compound having the following structure:

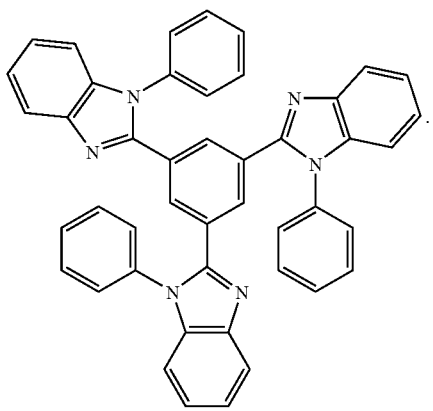

23. The organic light emitting diode according to claim 20, wherein said hole-blocking layer comprises a compound having the following structure:

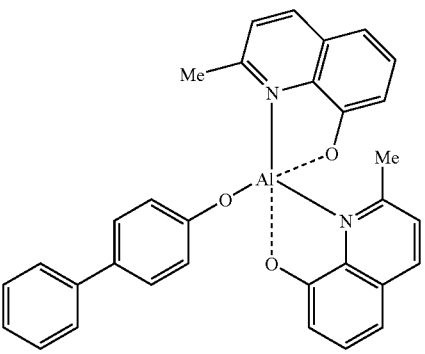

in which Me is methyl.

24. The organic light emitting diode according to claim 20, wherein said electroluminescent medium further comprises an electron-transporting layer provided between said hole-blocking layer and said negative electrode.

25. The organic light emitting diode according to claim 24, wherein said electron-transporting layer comprises a compound having the following structure:

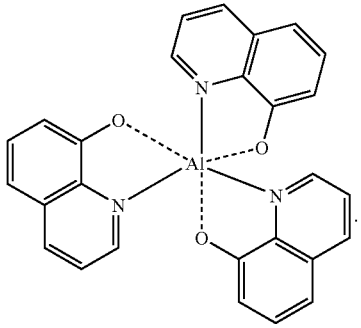

* * * * *